US005898557A

United States Patent [19]

Baba et al.

[11] Patent Number: 5,898,557

[45] Date of Patent: Apr. 27, 1999

[54] SWITCHING APPARATUS

[75] Inventors: Akira Baba; Hiroo Yabe; Takaaki Izawa, all of Shizuoka, Japan

[73] Assignee: Yazaki Corporation, Tokyo, Japan

[21] Appl. No.: 08/901,314

[22] Filed: Jul. 28, 1997

[30] Foreign Application Priority Data

Jul. 30, 1996 [JP] Japan .................................... 8-200234

[51] Int. Cl.[6] ........................................................ H02H 5/00

[52] U.S. Cl. ........................... 361/103; 361/100; 361/115

[58] Field of Search ..................................... 361/103, 115, 361/18, 100, 93

[56] References Cited

U.S. PATENT DOCUMENTS 5,434,443 7/1995 Kelly et al. ............................ 257/467

*Primary Examiner*—Jeffrey Gaffin
*Assistant Examiner*—Stephen W. Jackson
*Attorney, Agent, or Firm*—Armstrong, Westerman, Hattori, McLeland & Naughton

[57] ABSTRACT

To turn on or off semiconductor switches based on the current-duration product of a current flowing through them, the device of the present invention detects an ambient temperature of the harness and, based on thus detected ambient temperature, corrects a detected current value to compare the current-duration product of thus corrected current value to the threshold data, so that if that product value equals or exceeds that threshold data value, the semiconductor switches are turned off, thus avoiding the affection due to the heat from the engines or the semiconductor switches to effectively prevent the harness from fuming.

14 Claims, 21 Drawing Sheets

F I G . 7
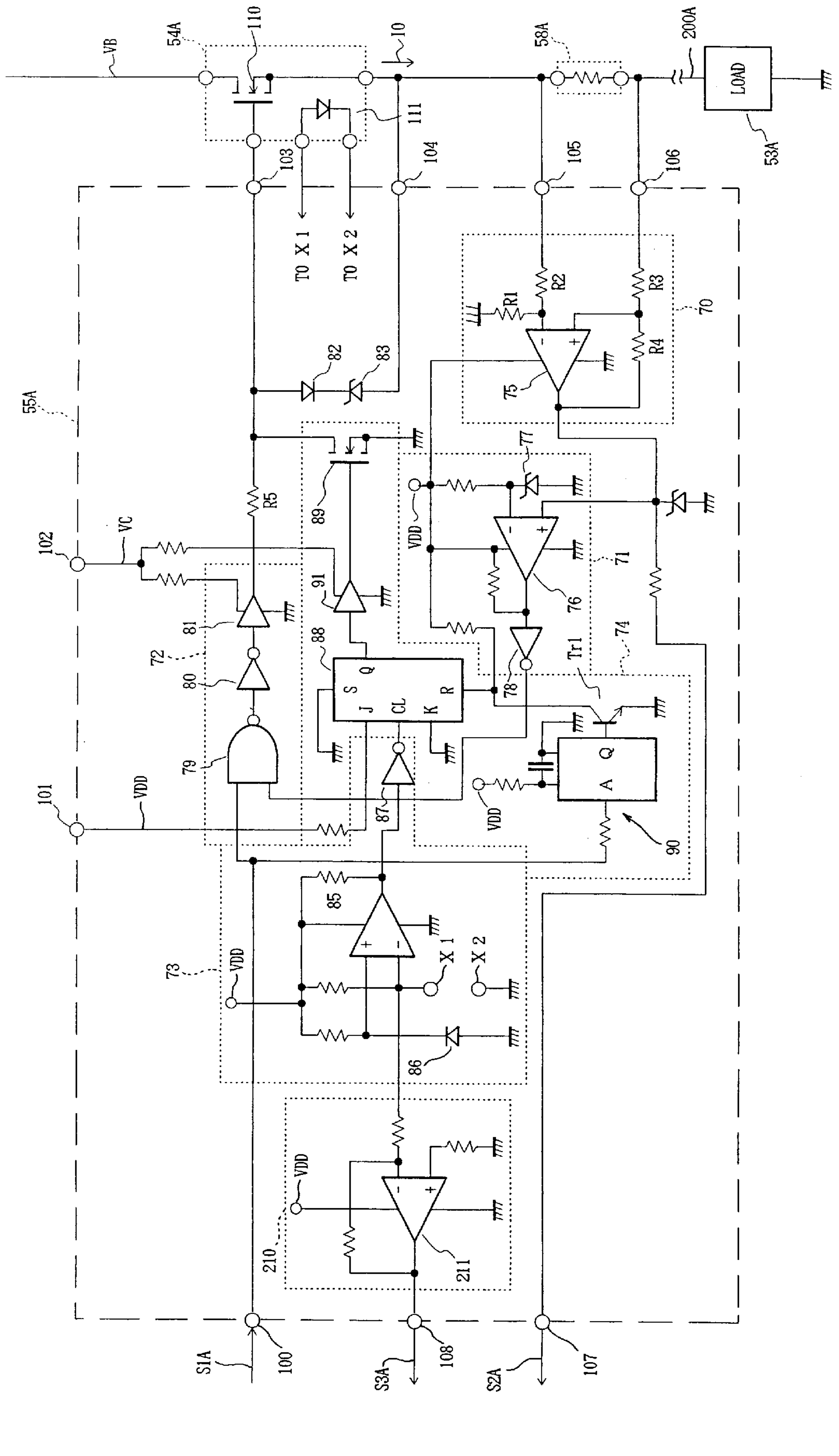

F I G. 9
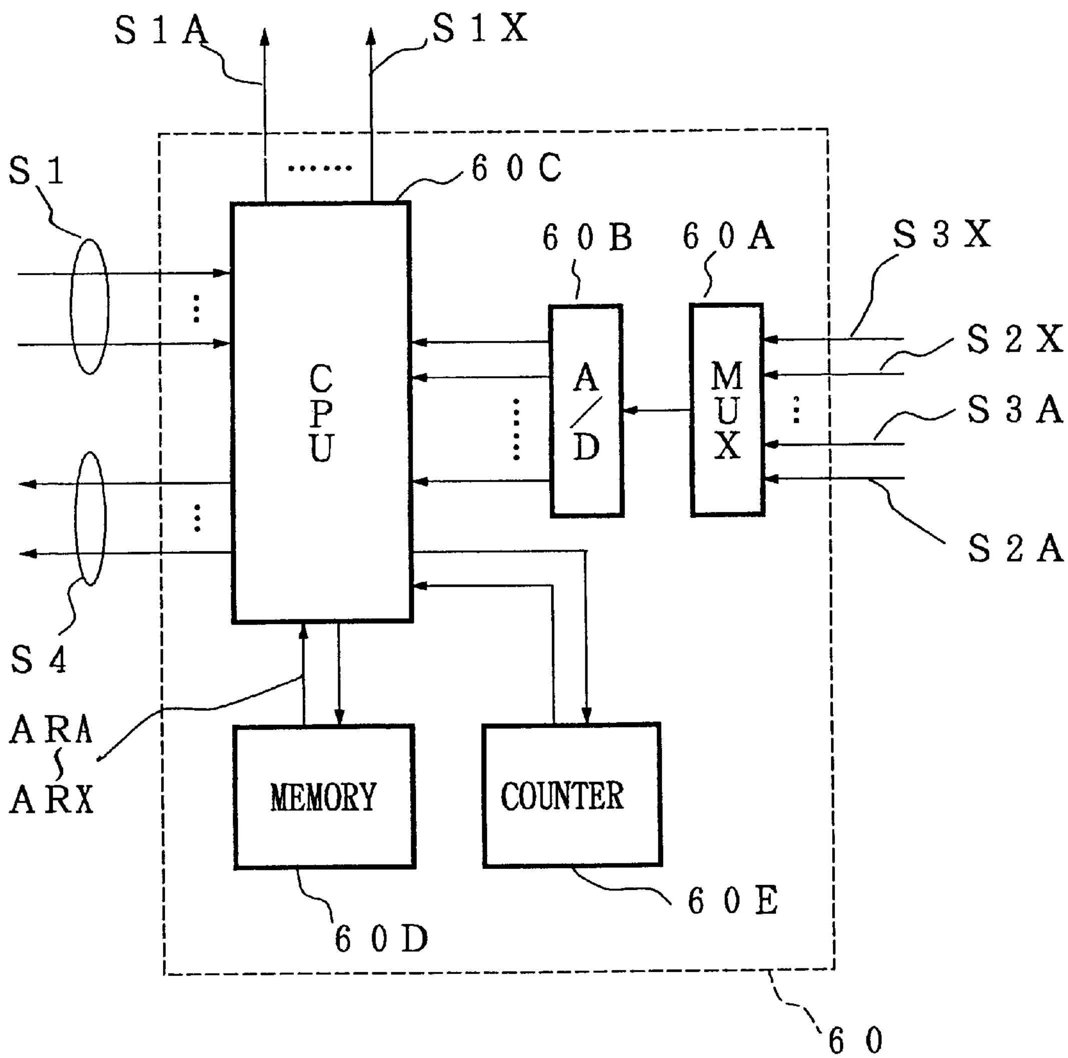

SWITCHING APPARATUS

BACKGROUND OF THE INVENTION

1. Field of the Invention

The present invention relates to a switching apparatus, which is capable of being used as a switching apparatus selectively supplying electric power from a battery to respective loads, for example in an automobile.

2. Description of the Prior Art

In a conventional motor vehicle, a number of switching circuits are mounted in order to selectively supply electric power from a Battery to respective electric parts (hereinafter, the electric part is called "load") in accordance with an operation of an operational switch such as an ignition key, light switch, and audio switch, etc.

FIG. 19 shows a schema of such conventional art, in which a battery 1 is connected with a junction block (J/B) 2, the junction block 2 being connected with operational switches SW1, SW2, . . . located on an operational panel 3. The junction block 2 is provided with switching circuits according to the number of the operational switches SW1, SW2, . . ., each of the switching circuits bringing a connection between a power supply line from the battery 1 and an electric line linked to respective loads into conduction (ON state) or out of conduction (OFF state).

With this configuration, the battery's power is selectively supplied to respective loads through the junction block 2 in accordance with an operation of the operational switches SW1, SW2, . . . For instance, if a head light switch is operated to ON state, the power line from the battery 1 and the electric line going to head lights 4A and 4B are set to ON state, whereby the head lights 4A and 4B are supplied with electric power and the lights 4A and 4B are turned on.

It should be noted that such a system includes a variety of sub-systems, in some of which the power is directly supplied to the load thereof like the head light 4A and 4B and in others of which the power outputted from junction block 2 is supplied through the switching circuits 6A and 6B like e.g., motors 5A and 5B driving a power window. These switching circuits 5A and 5B are switching-controlled by operational switches 7A and 7B.

Practically, the junction block 2 is configured as shown in FIG. 20. The junction block 2 is provided with a plurality of relays L1, L2, L3, . . . The relays L1, L2, L3, . . . include one relay which is directly controlled to ON or OFF by the operational switches SW1 and SW2 such as, e.g., the relays L1, L2 corresponding to the head lights 4A and 4B mentioned above and the other relay which is embodied by a relay L3 controlled to ON or OFF in accordance with conditions of an ignition switch 8.

The relays L1, L2 is supplied with the battery's power from the battery through a fusible link (FL) 9 and fuses F1, F2. Thus, the fusible link 9 is fused when a large current having an amount equal to or greater than a permissible value flows into the power line connecting between the battery 1 and the junction block 2, and in turn, the fuses F1 and F2 are fused when an overcurrent having an amount equal to or greater than the permissible value flows into the electric line (wire harness) connecting between the junction block 2 and the respective loads, whereby making it possible to prevent the whole of the power line from smoke-producing and from igniting and to prevent an overcurrent from flowing into the loads.

Similarly, the relay L3 is supplied with the battery's power from the battery 1 through the fusible link 9, an output terminal of the relay L3 being connected with respective loads 5A, 5B through fuses F3, F4 and the relays L4, L5.

In the meantime, a high-performance and inexpensive semiconductor switch has been made readily available to someone as the development of semiconductor manufacturing technology has surged forward in recent years. With relation to such situations, a switching circuit using a semiconductor switch is proposed instead of the above mentioned relays L1, L2, . . . which operate by means of mechanical contacts.

This type of switching circuit generally has a protective function of protecting a semiconductor switch from overcurrent and overheat. More specifically, a semiconductor switch is protected from them by way of forcibly off-controlling a semiconductor switching when a current having an amount equal to or more than the current rating has flowed into the semiconductor switch or when the temperature of the semiconductor switch has soared into a temperature equal to or more than a prescribed value.

FIG. 21 shows an example of switching circuits using the semiconductor switch, which is embodied by a switching circuit 30 called "Intelligent Power Switch". The switching circuit 30 is connected in positions corresponding to the respective relays L1, L2, . . . instead of the respective relays L1, L2, . . . mentioned above. It will be mentioned as to, for example if the switching circuit 30 is connected in place of the relay L1. In this example, a power input terminal 12 is connected with a fuse F1 (See FIG. 20) while an output terminal 13 is connected with a load 4A. Further, a control signal input terminal 14 is connected with a operational switch SW1. It should be here understood that, in the case of the switching circuit 30, a control voltage generating section (not shown in figure) is practically provided between the operational switch SW1 and the control signal input terminal 14, which supplies the control signal input terminal 14 with a control voltage of e.g. 5 V as an ON control signal from the operational switch SW1 when the operational switch SW1 is operated to ON but does not supply the control signal input terminal 14 with the control voltage when the operational switch SW1 is operated to OFF.

The switching circuit 30 comprises a abnormal status signal generating section for informing the outside thereof that an abnormal condition has occurred in the switching circuit 30 on the basis of a value of an output voltage $V_{OUT}$ from the semiconductor switch. The abnormal status signal generating section 41 is connected with an abnormal status display unit 43 through a CPU (Central processing Unit) 42 as shown in FIG. 19, which detects that a semiconductor switch (π MOS) 32 has been forcibly controlled to OFF by the action of the protective function of the switching circuit 30 in cases where the semiconductor switch 32 of the switching circuit 30 is supplied with an overvoltage, supplied with an overcurrent, or overheated, and then in response to the detection, sends an abnormal status signal to the CPU 42. The CPU 42 determines what has been gone wrong and which of the switching circuits 30 has been in an abnormal state on the basis of the abnormal status signal, and makes the abnormal status display unit 43 indicate the result of determinations.

A configuration of the switching circuit 30 having an arrangement of the intelligent power switch will be hereinafter described. The switching circuit 30 gives a π MOS-FET 32 a power voltage VB through an input terminal 12 connected with the fusible link F1 (See FIG. 20), and performs an ON/OFF control of the π MOS-FET 32 by a driver 33.

In addition, the switching circuit 30 is provided with: an overvoltage detecting circuit 34 for detecting the case that the power voltage $V_B$ corresponds to a certain overvoltage; a current detecting circuit 35 for detecting a overcurrent by comparing a value of a voltage obtained based on a value of a current flowing between a drain and a source of the π MOS-FET 32 with a value of a reference voltage Vref outputted from a reference voltage generating circuit 33A; and a temperature detecting circuit 36 for detecting a overheating of the π MOS-FET 32 by comparing a temperature voltage value $V_T$ obtained from a temperature sensor (not shown in figure) located near the π MOS-FET 32 with the reference voltage Vref, wherein the detecting results of the respective detecting circuits 34, 35, 36 enter into a NOR circuit 37. Also, the NOR circuit 37 is supplied with a control voltage $V_{IN}$ through an inverter 38.

An output of the NOR circuit 37 is supplied to the driver 33 and a charge pump circuit 39. The charge pump 39 operates only if the output of the NOR circuit 37 is positive in logic. Specifically, if it is so, the charge pump 39 generates a driving voltage necessary to operate the π MOS-FET 32 to ON by way of boosting a voltage of the power voltage VDD stabilized by a regulator 40, and supplies the driver 33 with the driving voltage. The driver 33 operates the π MOS-FET 32 to ON by way of applying a driving voltage produced by the charge pump 39 to a gate of the π MOS-FET 32 if an output of the NOR circuit 37 is positive in logic, while the driver 33 operates the π MOS-FET 32 to OFF in the way of applying no driving voltage as above to the gate of the π MOS-FET 32 if an output of the NOR circuit 37 is negative in logic.

In the switching circuit 30, in turn, an output voltage $V_{OUT}$ is supplied to the abnormal status signal generating section 41 through an inverter 44. The abnormal status signal generating section 41 comprises an n-channel MOS-FET 41A which operates to OFF if the π MOS-FET 32 is controlled to ON and the output voltage $V_{OUT}$ presents high voltage. As opposed to such operations, the MOS-FET 41A operates to ON if the π MOS-FET 32 is controlled to OFF and the output voltage $V_{OUT}$ presents low voltage. An drain terminal 41B of the MOS-FET 41A is pulled up.

The CPU 42 (See FIG. 19), therefore, can determine that the protective function is inoperative in the switching circuit 30 (that is, no abnormal status occurs) when no potential difference exists between the drain terminal 41B of the MOS-FET 41A and the source terminal 41C of the same. On the contrary, when a certain potential difference exists between the drain terminal 41B and the source terminal 41C, the CPU 42 can determine that the protective function is operating in the switching circuit 30 (that is, it is in abnormal status).

Although the above-mentioned switching circuit 30 provides an overheat-detection circuit 36 to protect the semiconductor switch (π MOS FET32) from thermal destruction, the heat from that semiconductor switch has not only such thermal destruction but also other adverse effects, leading to a variety of failures in such types of conventional switching circuits with poor protections.

For example, such a switching device has been proposed that has a switching circuit provided with the above-mentioned semiconductor switch's over-current protection and overheat protection features, as well as an anti-fuming function for the cables (wire harness) connecting the semiconductor switch and loads (see for example Japanese Patent Application No. H.-8-149623). This switching device will detect an electric current flowing through a semiconductor switch to monitor the current value itself and also other time-wise factors with a microcomputer and, if a large current flows to cause fuming from the harness, turned off the semiconductor switch, thus preventing the harness from fuming without providing any fuse in the downstream of the semiconductor switch.

However, this type of switching device does not consider the harness's fuming characteristics which change with the ambient temperature and the heat from the semiconductor switch, so that even when the harness is still largely yet to begin fuming that device may turn off the semiconductor switch or, oppositely, even when a large current flows so as to cause fuming, that device may not turn it off.

By the above-mentioned switching circuit 30, if the semiconductor switch 32 gets a rapid rise in temperature above a threshold temperature of the overheat detection circuit 36, the overheat protection mechanism functions to protect the switch 32 from overheating; however, when the switch 32 is kept at a temperature a little below the threshold one for a long time (for example, when it is kept at 140 degrees Celsius against a 150-degree threshold), the performance of the switch 32 may gradually deteriorate.

When the semiconductor switch 32 is kept at a relatively high temperature, a heat therefrom would transfer to other circuitry, thus causing an increase in temperature of the circuits such as a driver 33, over-current detection circuits 34 and 35 etc. shown in FIG. 21 actually having on/off control over the semiconductor switch 32 (hereinafter called a protection circuit because this circuitry functions to protect the semiconductor switch from over-current and overheating), so that this protection circuit may deteriorate in performance or malfunction. Such deterioration in the performance of the protection circuit would directly lead to the malfunctioning of the load supplied with power from that switching circuit, thus deteriorating the reliability of the entire system including the switching circuit.

If a plurality of switching circuits 30 are contained in a junction box, a rise in temperature of the semiconductor switch 32 of any one of those circuits 30 may have adverse effects on the other switching circuits 32. Moreover, the junction box, usually placed in the vicinity of the engine room of a car, may easily get heat from the engine, which is combined with the heat from the switching circuit 30 to deteriorate the switching circuit 30's performance.

SUMMARY OF THE INVENTION

The present invention, with those aspects taken into consideration, proposes a switching device that can easily avoid, with a simple configuration, various adverse effects of the heat emitted from the semiconductor switches and the engines.

To this end, a switching device as claimed in claim 1 of the present invention comprises as shown in the block diagram of FIG. 1: a semiconductor switch 110 which is turned on depending on the input of the control signal at the control signal input terminal, to furnish power to a load 53 connected to the output terminal; temperature detection means 111 which detects the ambient temperature of a cable 200 interconnecting the semiconductor switch 110 and the load 53; current detection means 58 which detects the magnitude of an electric current I0 flowing through the semiconductor switch 110; data storage means 60D which stores threshold data AR which considers the fuming characteristics of the cable 200; correction means 60C which corrects the value of a current obtained at the current detection means 58 according to the temperature detection results obtained at the temperature detection means 111; and control means 60 which compares the current-duration product of a correction current and its duration to the threshold data AR and, if that product exceeds that threshold data AR, feeds a signal to the semiconductor switch at its control signal input terminal to turn it off.

In the above configuration, if a current value obtained by the current detection means 58 is multiplied as it is with its duration to provide a product to be compared to threshold data AR, and, the semiconductor switch 110 is turned off when the product value exceeds the data AR, it is impossible to perform anti-fuming processing that matches the fuming characteristics of the cable 200 which change with its ambient temperature; to guard against this therefore, the device will correct a detected current against the ambient temperature of the cable 200 to compare the product of the corrected current value and its duration value to the threshold data AR and, when that product exceeds the threshold data AR, turn off the semiconductor switch 110. Thus, the device is able to perform anti-fuming processing which matches the fuming characteristics of the cable 200 which change with its ambient temperature.

In a switching device as claimed in claim 2, the correction means 60C would give higher corrected current values against higher ambient temperatures detected by the temperature detection means 111.

In the above-mentioned configuration, with a same current I0 flowing through the cable 200, the higher the ambient temperature the more easily that cable begins to fume, so that the higher that ambient temperature the higher value the current is corrected into. As a result, the higher the ambient temperature, the larger the product of the current and its duration, so that the control means 60C can easily turn off the semiconductor switch 110, thus preventing fuming at the higher ambient temperatures.

A device as claimed in claim 3 comprises as shown in the block diagram of FIG. 2: a semiconductor switch 110 which is turned on according to the control signal entered at the control signal input terminal, to furnish power supply 52's power to a load 53 connected to the output terminal; temperature detection means 111 which detects the ambient temperature of a cable 200 interconnecting the semiconductor switch 110 and the load 53; current detection means 58 which detects the magnitude of a current I0 flowing through the semiconductor switch 110; data storage means which stores threshold data AR which considers the fuming characteristics of that cable 200; control means 60C which compares the product of a current obtained by the current detection means 58 and its duration to the threshold data AR and, if that product exceeds that threshold data AR, feeds a signal to the semiconductor switch 110 at its control signal input terminal to turn it off; and correction means which corrects the value of the threshold data AR or the product compared and monitored by the control means 60C, according to the results of temperature detection by the temperature detection means 111.

In the above-mentioned configuration, if simply the semiconductor switch 110 is turned off when a product value of a current obtained by the current detection means 58 and its duration is found to exceed threshold data AR, it is impossible to Norm anti-fuming processing which matches the fuming characteristics of a cable 200 which change with its own ambient temperature; to guard against this, correction means would correct the value of that product or the threshold data AR according to that ambient temperature of the cable 200 detected by the temperature detection means 111, so that control means 60C can turn on or off the semiconductor switch 110 depending on thus corrected value of current-duration product or threshold data. As a result, it is possible to perform anti-fuming processing which matches the fuming characteristics of the cable 200 which change with its own ambient temperature.

In a device as claimed in claim 4, correction means would give higher values of the corrected current-duration product or lower values of the threshold data AR the higher the ambient temperature detected by the temperature detection means 111.

In the above-mentioned configuration, the higher its ambient temperature more readily the cable 200 begins to fume, so that the higher that ambient temperature the higher would be the corrected value of the current-duration product or the lower would be the threshold data AR. As a result, the easier the control means 60C can turn off the semiconductor switch 110 the higher rises the ambient temperature of the cable 200, thus preventing it from fuming at the higher temperatures.

A device as claimed in claim 5 comprises as shown in the block diagram of FIG. 3: a semiconductor switch 110 which is turned on according to a control signal entered at the control signal input terminal, to provide power supply 52 to a load 53 connected at the output terminal; temperature detection means 111 which detects the ambient temperature of a cable 200 interconnecting the semiconductor switch 110 and the load 53; current detection means 58 which detects the magnitude of an electric current I0 flowing through the semiconductor switch 110; data storage means which stores a plurality of threshold data pieces AR1 through ARN which are set in consideration of that cable's fuming characteristics for each plurality of its ambient temperatures; and control means which reads out from the data storage means 60D an appropriate threshold data piece out of the plurality of threshold ones which matches the detection results by the temperature detection means 111 and compares this threshold data to a current-duration product value obtained by the current detection means 58 and, if that product is found to equal or exceed that threshold data value, feeds a signal to the semiconductor switch 110 at its control signal input terminal, to turn it off.

In the above-mentioned configuration, the fuming characteristics of the cable 200 change with its ambient temperatures, so that the data storage means 60D stores beforehand a plurality of threshold data pieces of AR1 through AN which are set in consideration of those characteristics for a plurality of ambient temperatures of the cable 200, so that the control means 60C would compare the ambient temperature-dependent threshold data value to the current-duration product, to turn on or off that switch 110. Thus, it is possible to perform anti-fuming processing which matches the fuming characteristics of the cable 200 which change with its ambient temperatures.

In a device as claimed in claim 6, temperature detection means 111 is a temperature sensor provided in the vicinity of the semiconductor switch 110, to detect its temperature, so that the ambient temperature of the cable 200 can be determined on the basis of the detection results of temperature by this sensor when the semiconductor switch 110 is off.

In the above-mentioned configuration, generally the temperature sensor provided in the vicinity of the semiconductor switch 110 would monitor its heating by detecting the ambient temperature of the cable 200. Therefore, no other temperature sensors are necessary to detect the cable 200's ambient temperature, so that the number of necessary parts will not increase. Moreover, since any temperature detected by the temperature sensor when the semiconductor switch 110 is on would reflect only the heating of the semiconductor switch 110, this configuration would determine the ambient temperature of the cable 200 based on the detection results obtained when that switch is off.

A switching device as claimed in claim 7 has not only a configuration claimed in any one of claims 1 through 6 but also such over-current protection means 71 that protect a semiconductor switch 110 from an over-current by feeding it a signal at its control signal input terminal to turn it off when the value of a current obtained by current detection means 58 exceeds a certain level.

The above-mentioned configuration can not only prevent fuming of the cable 200 but also protect the semiconductor switch 110 from being destroyed due to an over-current by turning it off with the over-current protection means 71 when a catastrophic large current has flown through that switch 110 suddenly.

A switching device as claimed in claim 8 not only has a configuration claimed in any one of claims 1 through 7 but also comprises temperature detection means 111 which detects the temperature of a semiconductor switch 110 as well as overheat protection means 73 which protects the semiconductor switch 110 from overheat by feeding it a signal at its control signal input terminal to turn it off when a temperature detected by this temperature detection means 111 equals or exceeds a certain level.

The above-mentioned configuration can not only prevent fuming of the cable 200 but also prevent the semiconductor switch 110 from being destroyed due to overheating by turning it off with the overheat protection means 73 when the temperature of that switch 110 equals or exceeds a certain level.

A switching device as claimed comprises as shown in the block diagram of FIG. 4: a semiconductor switch 110 which is turned on when a control signal enters the control signal input terminal, to feed the power of power supply 52 to a load 53 connected at the output terminal; a temperature detection means 111 which detects the ambient temperature of the semiconductor switch 110; and control means 260C which feeds a signal to the semiconductor switch 110 at its control signal input terminal to turn it off when that ambient temperature equals or exceeds a certain level.

In the above-mentioned configuration, if the ambient temperature of the semiconductor switch rises because of a heat from that switch itself, the control means 260C turns it off, thus inhibiting an excessive rise in the ambient temperature of that switch 110. With this, it is possible to protect the electric circuitry around the semiconductor switch 110 from being damaged by the heating of that switch.

A switching device as claimed comprises: a protection circuit 55 which protects a semiconductor switch 110 from overheating and over-current by feeding it a control signal at its control signal input terminal to turn it off when that switch 110 is subjected to overheat or over-current; temperature detection means 111 which detects the overheating of the semiconductor switch 110 by using a temperature sensor provided in the vicinity of that switch 110; and control means 260C which takes as the ambient temperature the results detected by the temperature sensor when the semiconductor switch 110 is off.

In the above-mentioned configuration, the switching device provided with the protection circuit 55 to protect the semiconductor switch 110 from overheat and over-current will effectively use a temperature sensor given near that switch 110, to detect its ambient temperature. Thus, no other temperature sensors need to be provided to detect the ambient temperature of the semiconductor switch 110, thus preventing the number of parts desired from increasing. With this however, when the semiconductor switch 110 is on, the temperature detected by the temperature sensor reflects only the heating of the semiconductor switch 110; to guard against this, the device will determine the ambient temperature of the semiconductor switch 110 based on the results detected by the temperature sensor when that switch 110 is off.

A switching device as claimed in claim 9 comprises as shown in the block diagram of FIG. 4: a semiconductor switch which is turned on according to a control signal entering the control signal input terminal, to feed the power of power supply 52 to a load 53 connected to the output terminal; an overheat prevention circuit 55 which protects the semiconductor switch 110 from overheating by feeding it the control signal at its control signal input terminal to turn it off when that switch 110 is overheated; temperature detection means 111 which detects the temperature of the semiconductor switch 110; and control means 260C which monitors the detected temperature and, if thus detected temperature is below a temperature at which the semiconductor switch 110 is turned off by the overheat prevention circuit 55 and at the same time is higher than a certain level for a prescribed lapse of time, feeds a signal to that switch 110 at its control signal input terminal to turn it off.

In the above-mentioned configuration, the semiconductor switch 110 is protected by the protection circuit 55 from being thermally destroyed. If, on the other hand, the semiconductor switch 110 is kept for more than a prescribed lapse of time at a temperature a little lower than a threshold one due to the protection circuit 55, the control means 260C will turn off the semiconductor switch 110. With this, the semiconductor switch 110 is protected from being damaged heavily and its temperature is also prevented from increasing excessively even when that switch 110 is kept at a high temperature for a long lapse of time.

In a switching device as claimed in claim 10, temperature detection means 111 is formed in the same semiconductor chip as the semiconductor switch 110 is formed.

In the above-mentioned configuration, the temperature detection means 111 is formed in the same semiconductor chip as the semiconductor switch 111 is formed, so that its temperature can be detected accurately.

A switching device as claimed in claim 11 comprises in a housing as shown in the block diagram of FIG. 5: a plurality of semiconductor switches 110 which are turned on according to the control signal entered to the corresponding control signal input terminals to feed the power of power supply 52 to loads 53A through 53X connected to the output terminals; a plurality of protection circuits 55A through 55X which protect the semiconductor switches 110 from overheat and over-current by feeding them the control signal at their control signal input terminals to turn them off when those switches 110 are subjected to overheating or over-current; temperature detection means 111 which detects the temperature inside the housing; and control means 260C which feeds the control signal to the semiconductor switches at their control signal input terminals to turn them off when the temperature detected by the temperature detection means 111 equals or exceeds a prescribed value.

In the above-mentioned configuration, the semiconductor switches 110 are protected from being destroyed due to overheat or over-current by the corresponding protection circuits 55A through 55X. If, on the other hand, any one of the semiconductor switches 110 is kept at a temperature a little lower than a threshold value due to the protection circuits 55A through 55X for a log lapse of time or if a number of those semiconductor switches 110 are turned on at the same time, the temperature inside the housing will rise to have adverse effects on its internal semiconductor switches 110, the protection circuits 55A through 55X, and other circuits. In such a case, this switching device uses the control means 260C to turn off the semiconductor switches. Thus, a further increase in the temperature inside the housing is avoided, thus inhibit the affection due to heating.

A switching device claimed in claim 12 uses as temperature detection means 111 a plurality of corresponding temperature sensors provided near a plurality of semiconductor switches 110 to detect their overheating, so that control means 260C uses, in the decision in comparison to the threshold, the results of temperature detection obtained by a temperature sensor corresponding to any of the semiconductor switches 110 which is turned off or any other temperature sensor having the lowest temperature detected.

In the above-mentioned configuration, the ambient temperature of the semiconductor switches 110 will be detected by the temperature sensor originally provided near those switches to protect them from overheating, so that there is no need to provide any other temperature sensors to detect the ambient temperature. Moreover, by deciding a temperature detected by the temperature sensor when the semiconductor switch 110 is off to be the ambient temperature, it is possible to detect the internal temperature of the housing 51 kept from a high temperature due to heating of the semiconductor switches 110.

In a switching device claimed in claim 13, temperature sensors are formed in the same semiconductor chip as semiconductor switches 110 are formed.

In the above-mentioned configuration, the temperature detection means 111 is formed in the same semiconductor chip as the semiconductor switches 110 are formed, so that the temperature of those switches can be detected accurately.

In a switching device claimed in claim 14, housing 51 comes in a junction box mounted in a car.

In the above-mentioned configuration, the junction box is often placed near the car engine or other heating unit, so that its internal temperature may rise in many cases due to external heating as well as the semiconductor switches 110. To guard against this, a switching device claimed in any one of the claims 13, 14, and 15 can be used in the junction box subject to adverse effects caused by such heating, thus obtaining largely better effects to avoid deterioration due to heating.

BRIEF DESCRIPTION OF THE DRAWINGS

FIG. 7 is a circuit diagram showing the details of a switching device according to the first embodiment;

FIG. 9 is a block diagram showing a basic configuration of a microcomputer according to the first embodiment;

DESCRIPTION OF THE PREFERRED EMBODIMENTS

Various embodiments of the present invention will be described with reference to the accompanying drawings.

(1) First Embodiment

(1-1) Outline of switching device configuration

Figure 1:
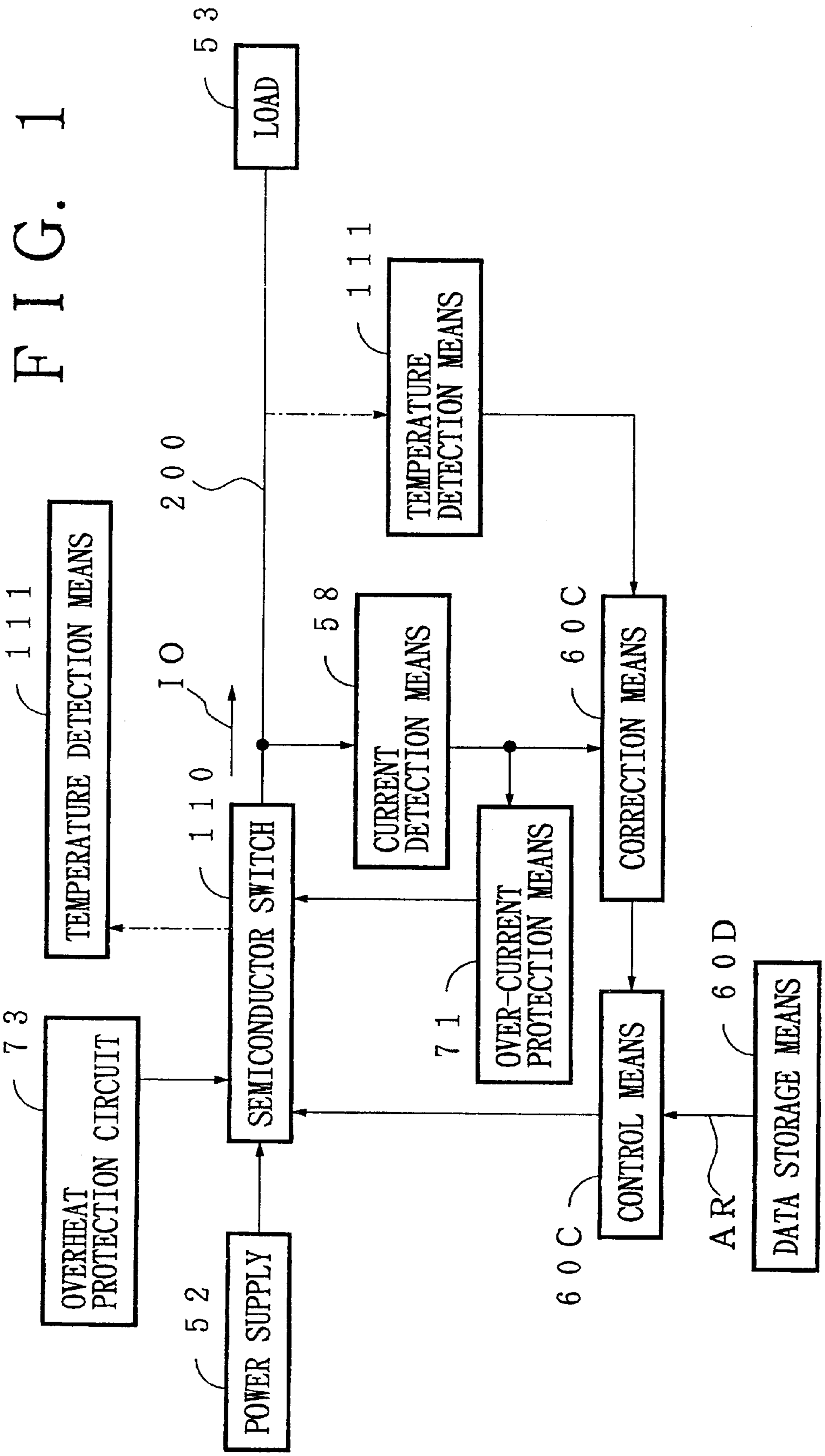
FIG.1 is a block diagram showing a basic configuration of the present invention claimed in claims 1, 2, and 6 through 8.
Figure 2:
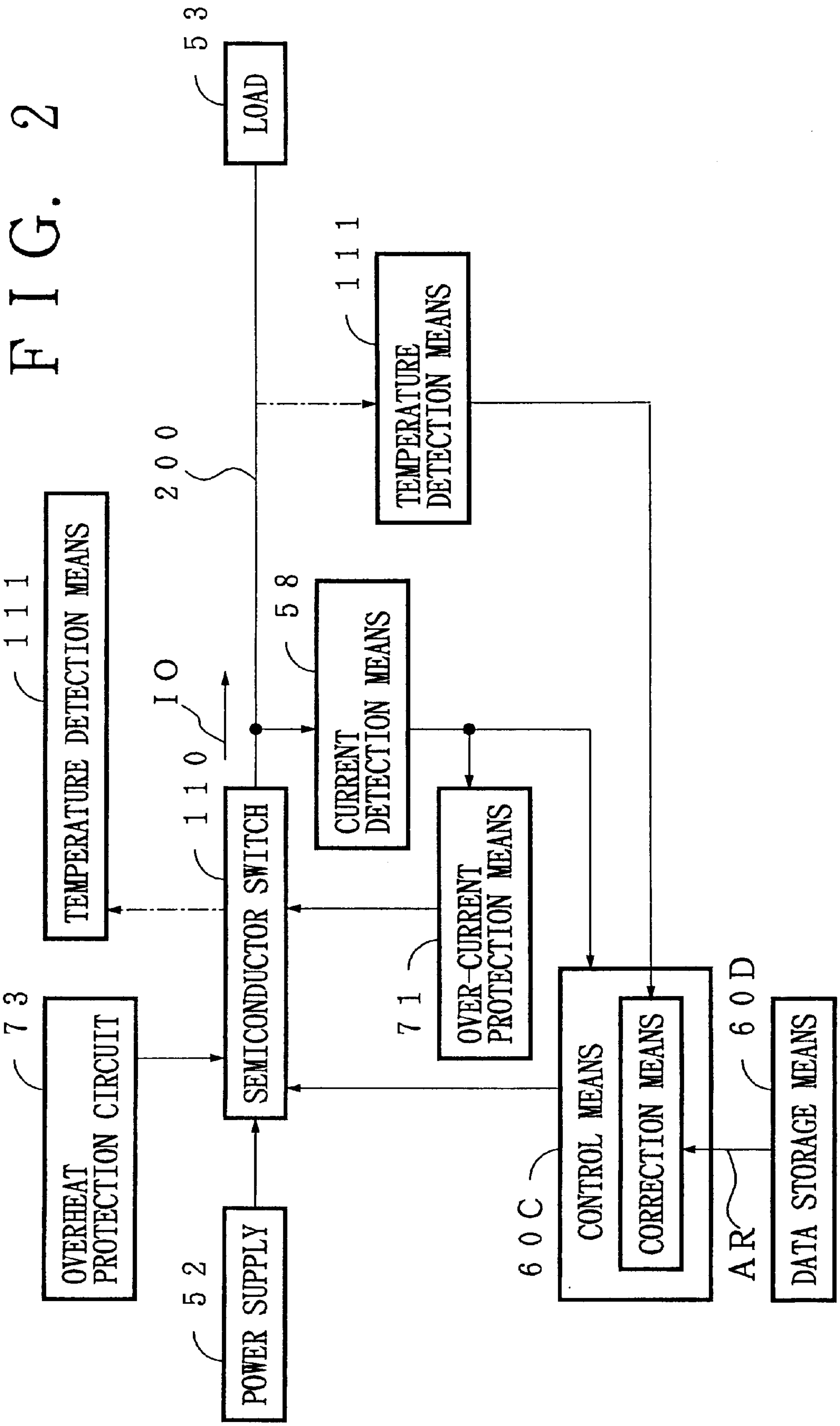
FIG. 2 is a block diagram showing a basic configuration of the present invention claimed in claims 3, 4, and 6 through 8.
Figure 3:
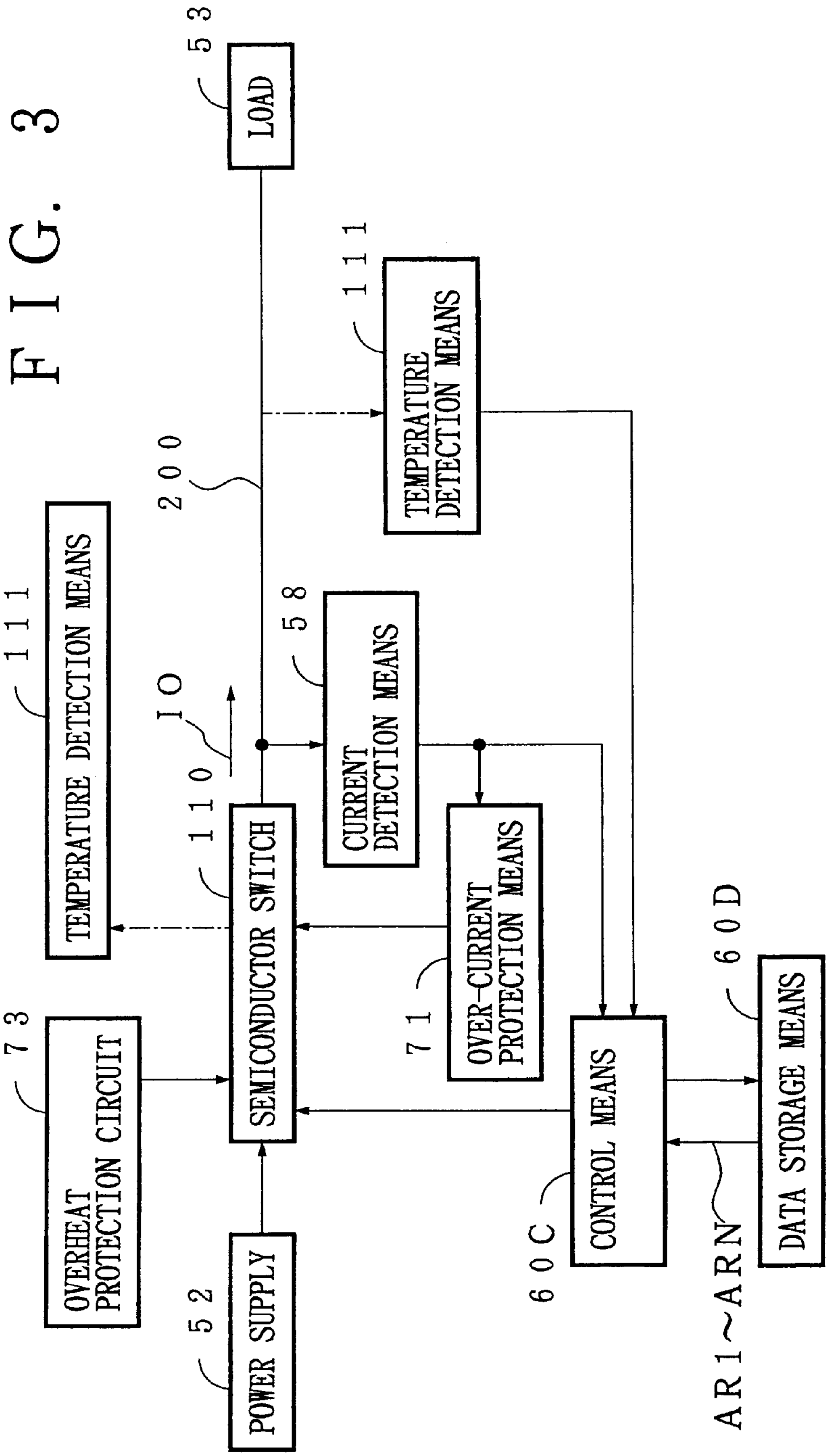
FIG. 3 is a block diagram showing a basic configuration of the present invention claimed in claims 5 through 8.
Figure 4:
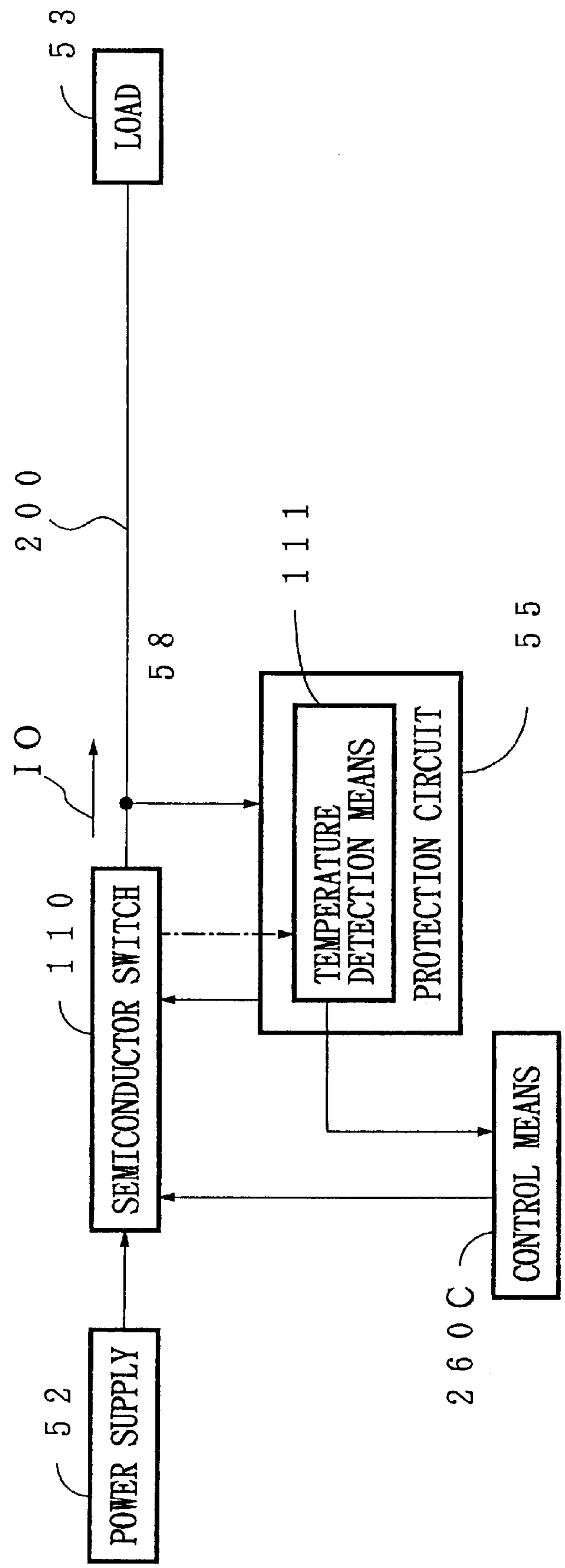
FIG. 4 is a block diagram showing a basic configuration of the present invention claimed in claims 9 through 12.
Figure 5:
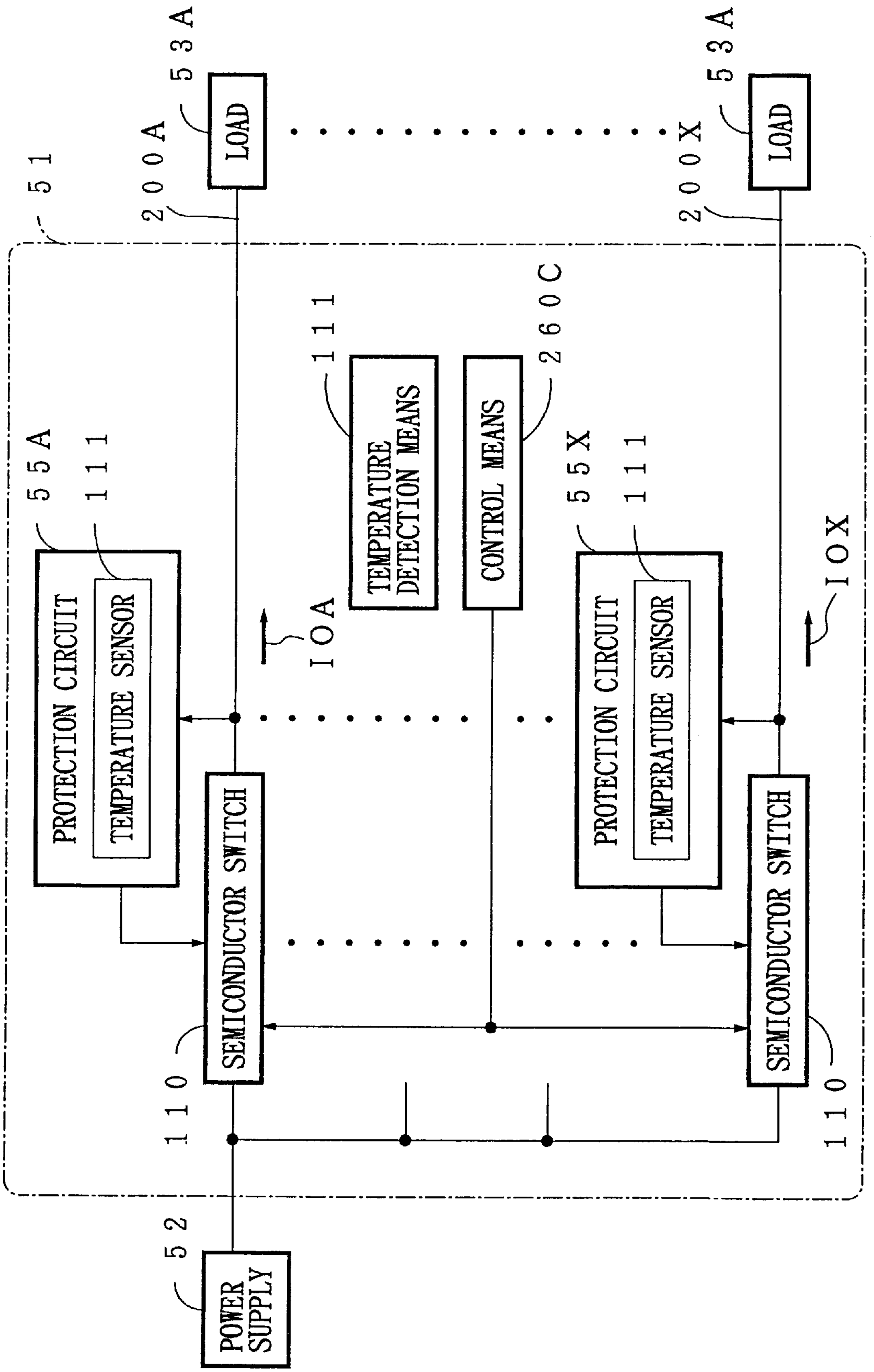
FIG. 5 is a block diagram showing a basic configuration of the present invention claimed in claims 13 through 14.
Figure 6:
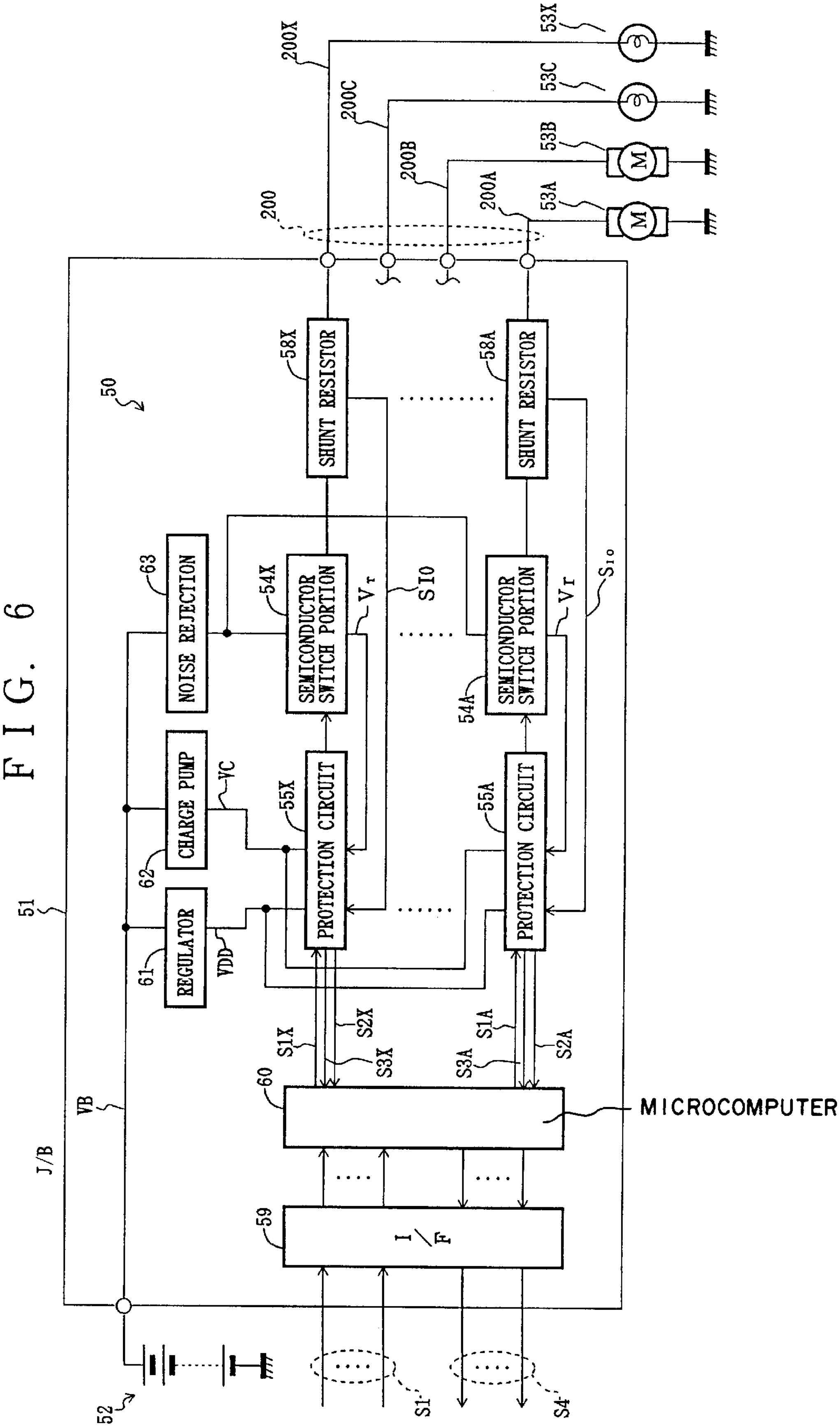
FIG. 6 is a block diagram showing an outlined configuration of a switching device according to the first embodiment.

In FIG. 6, block 50, which shows the block diagram of a switching device according to the present invention, is mounted in a junction box (J/B) 51 of an automobile. A switching device 50 comprises semiconductor switches; a plurality of semiconductor switch portions 54A through 54X which work each time the semiconductor switches are turned on and off, to selectively supply the voltage of power supply 52 to loads 53A through 53X; and a plurality of protection circuits 55A through 55X which selectively turn on and off the semiconductor switches provided corresponding to the semiconductor switch portions 54A through 54X so that they can be protected from over-current and overheat.

At an interface (I/F) 59 of the switching device 50 enters a switching control signal S1 (hereinafter called control signal S1) from operation switches (not shown) which correspond to the loads 53A, 53B, 53C, . . ., 53X, and then is sent to a microcomputer 60 from the interface 59.

The microcomputer 60 feeds out the control signal S1 sent from the operation switches corresponding to the loads 53A, 53B, 53C, . . ., 53X to the corresponding protection circuits 55A, 55B, 55C, . . ., 55X respectively. Note here that the protection circuit 55A, the semiconductor switch portion 54A, and a shunt resistor 58A for example correspond to the load 53A and, likewise, the protection circuit 55X, the semiconductor switch portion 54X, and a shunt resistor 58X, to the load 53X.

The following will describe only the relationship among the microcomputer 60, protection 55A, semiconductor switch portion 54A, shunt resistor 58A, and load 53A, because that relationship is the same as that among the microcomputer 60, protection circuits 55B through 55X, semiconductor switch portions 54B through 54X, shunt resistors 58B through 58X, loads 53B through 53X.

The semiconductor switch in the semiconductor switch portion 54A is controlled by the drive voltage fed from the protection circuit 55A in such a way that when turned on it sends out as is the voltage of power supply VB given via a noise rejecter circuit 63. Thus fed out power supply VB is then supplied to the load 53A via the shunt resistor 58A.

This embodiment here employs 12-volt power supply VB and for example a 10-megaohm shunt resistor 58A with an allowance of approximately plus-minus 5% realized by diffused resistors and polysilicon resistors merged in the same semiconductor chip, thus enabling accurate current detection.

The protection circuit 55A receives a stabilized power supply voltage VDD from a regulator 61 as well as a drive voltage VC shifted up by a charge pump 62, and responds to a control signal S1A sent from the microcomputer 60 to apply the drive voltage VC onto the gate of a semiconductor switch inside the semiconductor switch portion 54A so that the semiconductor switch can be turned on or off.

The protection circuit 55A receives temperature data $V_T$ from a temperature detection circuit provided in the semiconductor switch portion 54A as well as current-value information S10 which indicates the magnitude of an electric current flowing through the semiconductor switch from the shunt resistor 58A, to decide whether the semiconductor switch is overheated and also whether an over-current is flowing through that switch.

If the semiconductor switch is overheated or an over-current is flowing through it, the protection circuit 55A, even when having received from the microcomputer 60 the control signal S1A directing turning on the semiconductor switch, will stop supplying the drive voltage VC to the gate of the semiconductor switch to turn off that switch, thus protecting it from overheat and over-current.

The protection circuit 55A receives current-value data S10 from the shunt resistor 58A and then sends it out to the microcomputer 60 as a current detection signal S2A, while it receives temperature data $V_T$ from the temperature detection circuit of the semiconductor switch portion 54A and then sends it out to the microcomputer 60 as a temperature detection signal S3A.

Based on the current detection signal S2A, the microcomputer 60 monitors the current-characteristics as well as time-wise factors of a current flowing through the semiconductor switch, thus deciding whether the current may cause a wire harness 20 to fume at a cable 200A. If it decided that current to do so, the microcomputer 60 sends out to the protection circuit 55A the control signal S1A directing to forcedly turn off the semiconductor switch and, at the same time, it sends out an abnormality signal S4 via the interface 59 to tell it to an abnormality indication portion (not shown) comprising indicator lamps etc.

In such a case, the microcomputer 60 performs this anti-fuming processing taking into account the current detection signal S2A as well as the temperature detection signal S3A. This eliminates such troubles that the semiconductor switch may be turned off even when the harness is largely yet to begin fuming and also, oppositely, that the semiconductor switch cannot be turned off even when such a large current as suspected to cause the harness 200 to fume is flowing, thus effectively preventing the harness 200 to fume.

(1-2) Details of switching device configuration (1-2-1) Configuration of semiconductor switch portions protection circuits The following will describe the detailed configuration of the semiconductor switch portions 54A through 54X and the protection circuits 55A through 55X of a switching device according to this embodiment, with reference to FIG. 7. FIG. 7 shows a set of a protection circuit, a semiconductor switch portion 54A, a shunt resistor 58A which corresponds to a load 53A, as a representative of a plurality of protection circuits 55A through 55X, a plurality of semiconductor switch portions 54A through 54X, a plurality of shunt resistors 58A through 58X, and a plurality of loads 53A through 53X which are shown in FIG. 6.

In this embodiment, the semiconductor switch portion 54A, the protection circuit 55A, and the shunt resistor 58A are formed in different semiconductor chips. In the same semiconductor chip as the semiconductor switch portion 54A is formed, a power MOS FET 110 is formed as the semiconductor switch as well as a temperature detection circuit 111 as temperature detection means to detect the ambient temperature of this semiconductor switch and the cable 200A.

The protection circuit 55A roughly comprises: a current detection circuit which detects an electric current I0 flowing through the power MOS FET 110, based on a voltage across the shunt resistor 58A; an over-current detection circuit 71 which compares a voltage value corresponding to a current obtained by the current detection circuit 70 to a reference voltage corresponding to the rated current of the MOS FET 110, to decide whether such an over-current is flowing through the MOST FET 110 as to damage it; a logical-product circuit 72 which selectively supplies to the gate of the MOS FET 110 a drive voltage which corresponds to a logical product of the detection results by the over-current detection circuit 71 and the control signal S1A; an overheat detection circuit 73 which compares a detection voltage (tantamount to the above-mentioned temperature data $V_T$ with reference to FIG. 6) which corresponds to an MOS FET 110's temperature obtained by the temperature detection circuit 111 to the reference voltage, to decide whether the MOS FET 110 is up to such a temperature as to be destroyed thermally; an overheat prevention circuit 74 which forcedly drops the gate voltage for the MOS FET 110 to turn it off if the detection results by the overheat detection circuit 73 are decided to cause an overheat; a temperature-signal shaping circuit 210 which shapes a temperature detection signal S3A by amplifying a difference in voltage across the diode of the temperature detection circuit 111.

The current detection circuit 70 determines a current value I0 flowing through the shunt resistor 58A, based on a voltage across the shunt resistor 58A. That is, the current detection circuit 70 feeds a potential appearing at one end of the shunt resistor 58A to a differential amplifier circuit 75 at its non-inverting input terminal via an input terminal 105 and voltage-division resistors R1 and R2 and also does it feed a potential appearing at the other end of the shunt resistor 58A to the differential amplifier circuit 75 at its inverting input terminal via an input terminal 106 and an input resistor R3, while at the same time, this circuit 70 connects the inverting input terminal and the output terminal of the differential amplifier circuit 75 with a resistor R4 therebetween, so that this amplifier circuit can feed out a voltage which corresponds to a current I0 sent out of the MOS FET 110. A detection voltage by this current detection circuit 70, i.e. the current detection signal S2A, is sent to the microcomputer 60 via an output terminal 107.

The over-current detection circuit 71 feeds a detection voltage from the current detection circuit 70 to a comparator 76 at its non-inverting input terminal and also the reference voltage corresponding to an MOS FET 110's rated current generated by a reference-voltage generator 77 to that comparator 76 at its inverting input terminal, and when the detection voltage equals or exceeds the reference voltage, that circuit 71 feeds out a positive potential (hereinafter called the positive logic, in contrast to the negative logic for the reversed case with a zero potential). Then, the output of the comparator 76 is sent to a logical-product circuit 72 via an inverter 78. Thus, the over-current detection circuit 71 feeds a positive-logic output when an ordinary current is flowing through the MOS FET 110, while on the other hand it feeds a negative-logic output when such an over-current is flowing through the MOS FET 110 as to damage it.

The logical-product circuit 72 feeds the control signal S1A to a NAND gate 79 at its one input terminal via a control-signal input terminal 100 and also a logical state from the over-current detection circuit 71 to that NAND gate 79 at its other input terminal, to NAND-tie these two inputs. The output of the NAND gate 79 is sent to a buffer 81 via an inverter 80. Then, the output of the buffer 81 is fed to the gate of the MOS FET 110 via a resistor R5.

Here, the logical-product circuit 72 feeds out a positive-logic signal from the inverter 80 if, for example, the control signal S1A is of the positive logic (this embodiment assumes that the positive-logic output is of an about 5V potential and the negative-logic output is of a 0V potential) and also if the output of the over-current detection circuit 71 is of the positive logic, which means that no over-current is detected. If, on the other hand, the control signal S1A is of the positive logic and the output of the over-current detection circuit 71 is of the negative logic, the logical-product circuit 72 feeds out a negative-logic signal from the inverter 80.

As can be seen from this, the logical-product circuit 72 feeds out a negative-logic signal when the over-current detection circuit 71 gives a logical state which indicates that an over-current is flowing through the MOS FET 110 or when the control signal S1A is given to turn off the MOS FET 110.

The buffer 81 is supplied, via a terminal 102, with a drive voltage VC generated by a charge pump 62, thereby furnishing a voltage at the gate of the MOS FET 110 high enough to turn it on. That is, in this, a 5V of positive-logic output fed out of the inverter 80 is shifted up by 12V at the buffer 81 to 17V appearing at its output terminal.

Therefore, if the inverter output is of the positive logic, the gate of the MOS FET 110 is provided with 17V so that it may be turned on normally. If the inverter output is of the negative logic on the other hand, the buffer 81 gives an output of the ground potential, resulting in no potential difference between the gate and the source terminals so that the MOST FET 110 is turned off. Between the gate and the source of the MOS FET 110 are connected a diode 82 and a Zener diode 83, which enables an over-voltage if any at the gate to be bypassed, thus preventing the MOS FET 110 from being damaged.

In the overheat detection circuit 73, the comparator 85 is connected with the temperature detection circuit 111 of the semiconductor switch portion 54A at its inverting input terminal and also with the reference-voltage generator 86 at its non-inverting input terminal.

Therefore, at the overheat detection circuit 73, as the temperature of the MOS FET 110 rises, the temperature detection circuit 111-constituent diode lowers in its resistance value, to gradually decrease the potential at the inverting input terminal of the comparator 85 down below the reference voltage, whereupon that comparator gives an output of the positive logic. For example, when the temperature of the MOS FET 110 is 150 degrees Celsius or above, a positive-logic output is fed out in setting. Thus fed-out positive-logic output at the comparator 85 is sent to the overheat prevention circuit 74 via the inverter. 87.

The overheat prevention circuit 74 roughly comprises: a JK flip-flop 88 which operates on a logical value sent from the overheat detection circuit 73 and the control signal S1A; and an MOS FET 89 which operates on the output of this JK flip-flop 88, changing the gate voltage for the main MOS FET 110 to turn it on and off.

Note here that in setting the power MOS FET 110 has a rated current handling capability of about 10 A as against about 10 mA of the MOS FET 89, with a circuit-dimensional ratio of 1/1000 approximately.

The overheat prevention circuit 74 is detailed as follows: The JK flip-flop 88 is provided with the logical output of the overheat detection circuit 73 at its clock-signal input terminal CL and also with the collector terminal of a transistor Tr1 at its reset input terminal R. This transistor Tr1 is provided at its base terminal with the control signal S1A via a one-shot multivibrator 90, so that when the control signal S1A has shifted from the negative logic to the positive logic, the one-shot multivibrator 90 has a leading edge at its output pulse to cause a current to flow through the transistor Tr1 from its collector to emitter, whereupon the potential at the reset input terminal R falls to reset the JK flip-flop 88. At its input terminal J, this JK flip-flop 88 is provided via the input terminal 101 with a power-supply voltage VDD stabilized by a regulator 61, with its input terminals K and S (set) both grounded.

Figure 8:
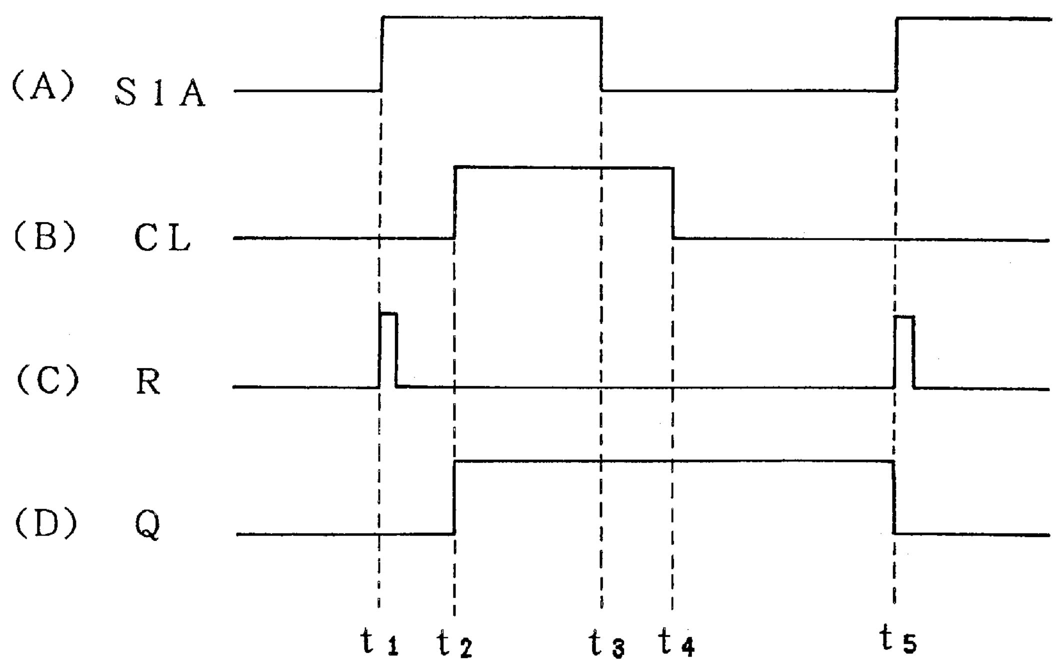
FIG. 8 is a timing chart used in the description of how a JK flip-flop shown in FIG. 7 operates.

The following will describe how the JK flip-flop 88 operates, with reference to FIG. 8. When the control signal S1A rises to the positive-logic state at a time point t1 (see FIG. (A)), the output pulse of the one-shot multivibrator 90 rises to raise the potential at the base terminal of the transistor Tr1, thus feeding to the reset input terminal R a reset pulse having a pulse width which corresponds to that output pulse (see FIG. (C)) so that the JK flip-flop 88 may be reset.

If, in this condition, the temperature of the MOS FET 110 rises above a prescribed level at a time point t2, the logical output fed from the overheat detection circuit 73 to the lock-signal input terminal CL turns positive-logic (see FIG. 8), resulting in the positive logic of the Q output. Next, even when the input control signal S1A turns negative-logic at a time point t3 or even when the logical output entered from the overheat detection circuit 73 to the clock-signal input terminal CL turns negative-logic, the JK flip-flop 88 stays at this state, continuing to feed out a positive-logic output.

Then, at a time point t5 at which the control signal S1A changes from negative logic to positive logic in state again and the reset pulse enters the reset input terminal R, the Q output is changed from positive logic to negative logic (see FIG. 8 (D)).

Thus, the JK flip-flop feeds out a positive-logic Q output only when the overheat detection circuit 73 turns positive-logic in its output state with the control signal S1A being positive-logic, and this state is kept even when the overheat detection circuit 73 turns negative-logic subsequently. The following will describe the reasons why the overheat prevention circuit 74 has a latch configuration and why the MOS FET 110 is kept in a off state until the control signal S1A reaches to turn on the MOS FET 110.

If the overheat prevention circuit 74 is not of a latch configuration so that the MOS FET 110 may be turned on and off real time based on the temperature detection results, as soon as the MOS FET 110 reaches a prescribed temperature or over to be turned off, its temperature begins to fall to turn it off. When its temperature rises again, the MOS FET 110 is turned off. Repetition of such on-off operations in rather a short period of time would furnish unstable power supply to the load 53A, so that the MOS FET 110 is recovered to its on state only when the control signal S1A is once turned negative-logic and then back to positive-logic again.

The JK flip-flop 88 supplies its Q output to the MOS FET 89 at its gate via the buffer 91 which is provided, like the above-mentioned buffer 81, with an output of the charge pump 62 to shift up its input by 12V. As a result, when a positive-logic state of Q output (5V) is fed out from that flip-flop 88, the MOS FET 89 is provided with a 17V input at its gate, to be turned on. When, on the other hand, a negative-logic state of Q output (0V) is fed out, the MOS FET 89 is provided with only a ground potential, to be turned off.

With this, when the MOS FET 89 is turned on, the gate of the MOS FET 110 has a ground potential, to be turned off forcedly irrespective of the state of the logical output of the logical-product circuit 72. When the MOS FET 89 is turned off on the other hand, the gate of the MOS FET 110 has a potential according to the state of the output of the logical-product circuit 72.

Thus, in the overheat detection circuit 73 and the overheat prevention circuit 74, at long as the MOS FET 110 is held at a temperature at or above a prescribed level, that FET 110 can be turned off forcedly, thus avoiding damages due to overheating.

The temperature-signal shaping circuit 210 shapes a temperature detection signal S3A by amplifying with an amplifier circuit 211 a voltage difference across a diode of the temperature detection circuit 111, and then sends it out to the microcomputer 60 via the output terminal 108.

(1-2-2) Configuration of microcomputer

Having such a configuration as shown in FIG. 9, the microcomputer 60 uses multiplexer (MUX) 60A to serialize those current detection signals S2A through S2X fed out from the output terminal 107 for the protection circuits 55A through 55X and those temperature detection signals S3A through S3X fed out from the output terminal 108 for those circuits 55A through 55X, and then sends out the serialized results to an analog-to-digital converter circuit (A/N) 60B. The analog-to-digital converter circuit 60B converts each of the current detection signals S2A through S2X and the temperature detection signals S3A through S3X into for example 8-bit digital data and then sends out the data to the CPU (Central Processing Unit) 60C.

A memory 60D stores threshold data ARA through ARX which indicates the upper limit of an electric current of current-duration product flowing through the cables 200A through 200X beyond which the harness 200 may begin to fume. When the CPU 60C, based on the A/D converter circuits 54A output data and the threshold data ARA through ARX, decides that a current which may cause the harness 200 to fume is flowing through any of the cables 200A through 200X, it stops power supply to the corresponding cables of 200A through 200X, i.e. turns off the corresponding MOS FET 110, thus preventing the wire harness 200 from fuming. In this case, the CPU specifically turns on or off the MOS FET 110 based not only on the current-duration product of a current flowing through the MOS FET 110 but also on the ambient temperature of the harness 200. With this, the harness can be effectively prevented from fuming.

Figure 10:
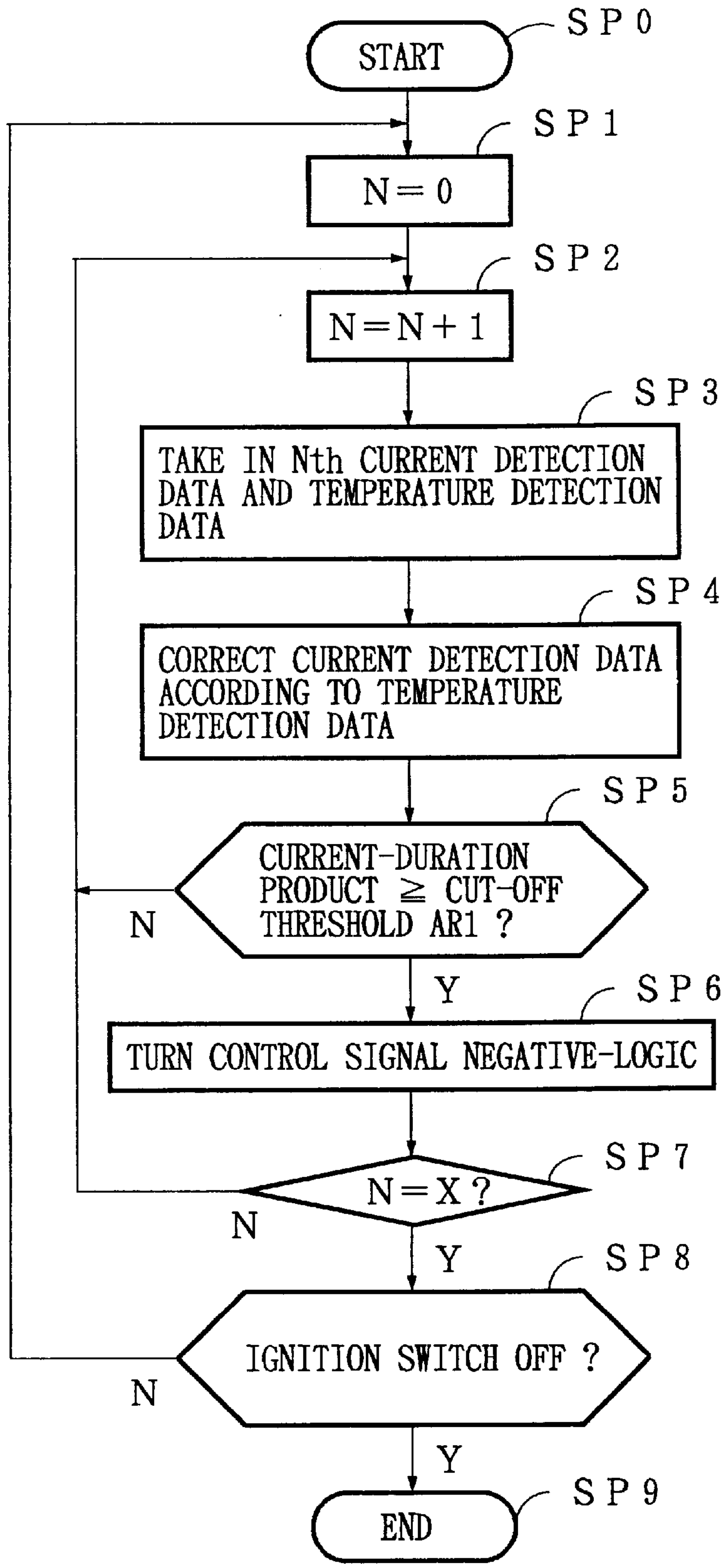
FIG. 10 is a flow chart showing an anti-fuming procedure for a wire harness by a microcomputer shown in FIG. 9.

To do so, the CPU 60C actually follows such a processing procedure as shown in FIG. 10. At a step SP1, the CPU 60C first rests the counter value N of a counter 60E and, at a step SP2, increments the count value N and then goes to a step SP3. At the step SP3, the CPU 60C takes in the current detection data which corresponds to the N'th MOS FET 110 from among a plurality of current detection data pieces which each correspond to each of the current detection signals S2A through S2X sent from the analog-to-digital converter circuit 60B, and also does it take in the temperature detection data obtained by a temperature detection circuit 111 which corresponds to a currently turned-off MOS FET 110 from among a plurality of temperature detection data pieces which each correspond to each of the temperature detection signals S3A through S3X. If, in this case, no MOS FET 110 is currently off, the temperature detection data of the lowest detection temperature is taken in from among the plurality of temperature detection data pieces.

Next, at a step SP4, the CPU 60C corrects the current detection data taken in at the step SP3 base on the temperature detection data taken in at the same step. In this case, this embodiment uses the temperature detection data taken in at the step SP3 as the ambient temperature of the harness 200. That is, the temperature detection data taken in at the step SP3 is totally free from the effects of the heating of any particular MOS FETs 110 and therefore can be considered to be the ambient temperature of the MOS FETs 110 or the intra-junction box 51 temperature or therefore the ambient temperature of the harness 200.

At this correction step, if the ambient temperature of the harness 200 indicated by temperature detection data is higher than a certain temperature for example 25 degrees Celsius, the current detection data is also corrected to a larger value proportionally, while if the ambient temperature of the MOS FETs 110 is lower than a certain value, the current detection data is also corrected to a smaller value proportionally.

Figure 11:
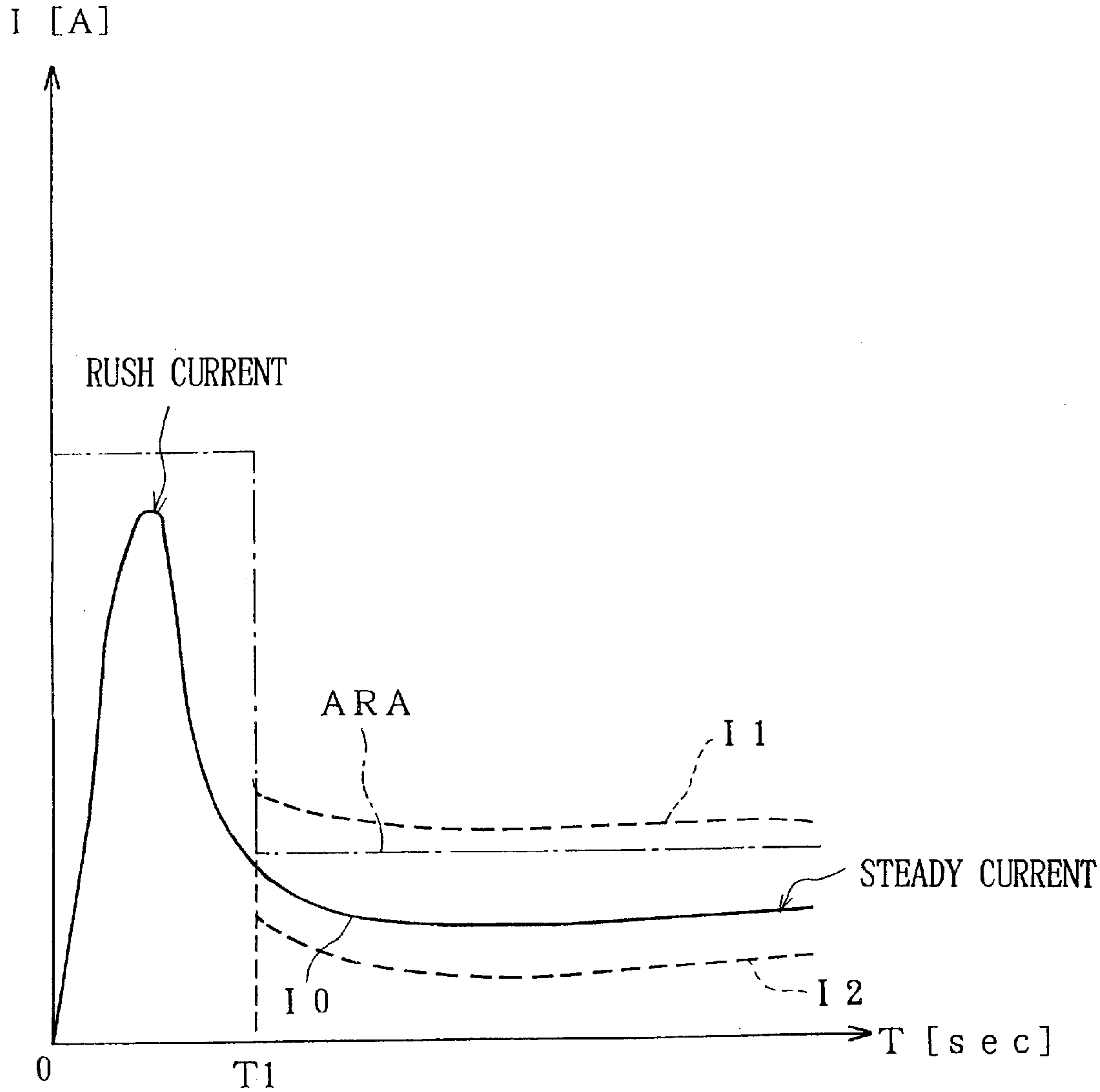
FIG. 11 is a graph used in the description of detection current correction by the microcomputer according to ambient temperature values of the harness.

Next, at a step SP5, the CPU 60C, as shown in FIG. 11, compares to the threshold data ARA read out from the memory 60D each of the current-duration products of corrected current values I1 and I2, where a current value I1 has been corrected to a larger value from a detected current value I0 corresponding to the ambient temperature of the wire harness 200 found to be higher than a certain value and a current value I2 has been corrected to a smaller value corresponding to that ambient temperature found to be lower than a certain value.

The threshold data ARA has been selected beforehand in consideration of the fuming characteristics of the harness 200 against the cable 64A, so that the plurality of threshold data ARA through ARX stored in the memory 60D come in different values with different thickness values etc. of the cables 200A through 200X connecting the MOS FETs 110 and the loads 53A through 53X respectively. The CPU 60C reads out from among those threshold data pieces ARA through ARX only the threshold data corresponding to any one of the cables 200A through 200X which is subject to decision for fuming currently.

As can be seen from FIG. 11, the threshold data ARA through ARX is set at an extremely high level in the region of rush current flowing so that no MOS FETs 110 may be turned off due to a rush current.

If, at the step SP5, it obtains a positive decision, i.e. decides that such a current that may cause the harness 200 to fume is flowing through it, the CPU 60C moves to a step SP6 to send out control signals S1A through S1X to turn off the MOS FETs 110. Next, at a step SP7, the CPU 60C reads out the count value N at the counter 60E to decide whether all the processings of the steps SP3 through SP6 are completed for all of the MOS FETs 110, i.e. all of the cables 200A through 200X. If having decided it to be negative, the CPU 60C returns to the step SP2 to increment the count value N, and then executes the above-mentioned anti-fuming processing of the steps SP3 through SP6 onto the next MOS FETs 110, i.e. the next cables 200A through 200X.

When, in course of time, having obtained a positive decision at the step SP7 upon the completion of the processing at the steps SP3 through SP6 on the all of the MOS FETs 110, the CPU 60C returns to a step SP8 to decide based on the control signal S1 whether the ignition switch is off. If it is not turned off yet, the CPU 60C returns to the step SP1 to execute the anti-fuming processing for the second time on all of the MOS FETs 110. Thus, the CPU 60C repeats the anti-fuming processing onto all of the MOS FETs 110 until the ignition switch is turned off, whereupon it moves from the step SP8 to a step SP9 to put an end to this anti-fuming processing procedure.

The following will describe the reason why the CPU 60C first corrects detection current values according to the ambient temperature of the harness 200 and then compares the corrected detection current values to the threshold data ARA through ARX: That is, the threshold data ARA through ARX stored in the memory 60D indicates possibilities that the harness whose ambient temperature is at a certain reference level, for example, 25 degrees Celsius may begin to fume if such a current as to further increase the current-duration product flows through any of the cables 200A through 200X, so that if the ambient temperature of the harness 200 is changed above or below this reference level, its fuming characteristics are also changed accordingly.

Figure 12:
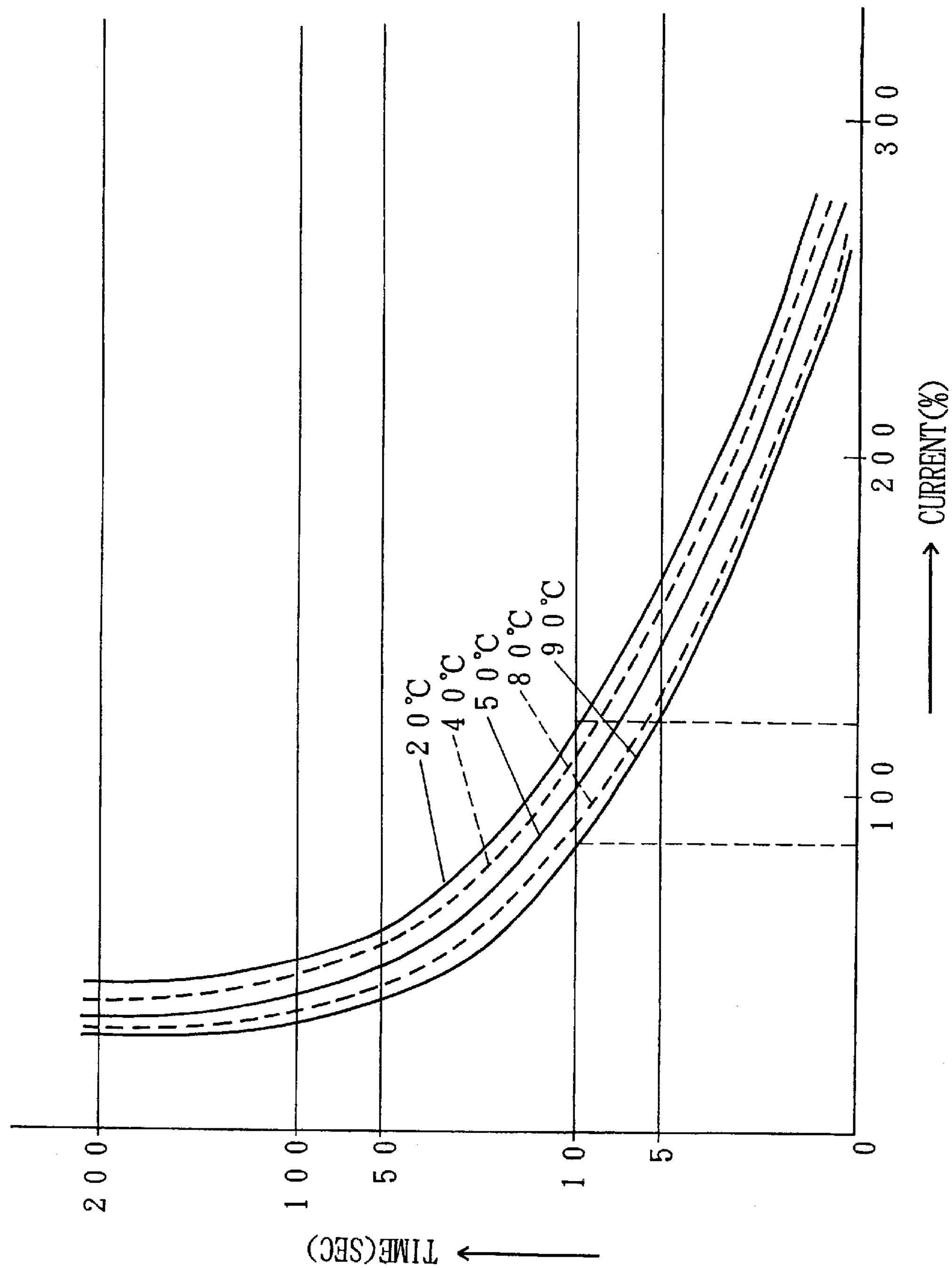
FIG. 12 is a graph showing the relationship between ambient temperature of the harness and its fuming characteristics.

FIG. 12 shows the relationship between the ambient temperature of the harness 200 and its fuming characteristics. As can be seen from it, the higher the ambient temperature, the easier will the harness 200 begin to fume with smaller current or in shorter periods of time. In other words, higher ambient temperatures correspond to smaller current-duration products at which the harness begins to fume. Therefore, if a detection current value is used as it is to calculate a current-duration product and this value is compared to the threshold dates ARA through ARX set beforehand on a premise that the ambient temperature of the harness 200 is 25 degrees Celsius in an attempt to turn off the MOS FETs 110, they may be turned off mistakenly even when the harness 200 is largely yet to begin to fume, i.e. when that ambient temperature is lower than 25 degrees Celsius or they cannot be turned off even when such a current that may cause the harness 200 to fume is flowing through it, i.e. when that ambient temperature is higher than 25 degrees Celsius.

To guard against this, as mentioned earlier, this embodiment will first correct detection current values according to the ambient temperature of the harness 200 and then compare current-duration products of thus corrected detection current values to the threshold data ARA through ARX, thereby executing the effective anti-fuming processing.

The following will describe the examples of correcting detection current values according to the ambient temperature with reference to FIG. 12. FIG. 12 shows the relationship between the current and the time which cause the harness to begin to fume. In it, the percentage of a current that can flow through the harness 200 for 10 seconds when its the ambient temperature is 50 degrees Celsius is supposed to be 100%. If, here, you compare between a fuming curve for an ambient temperature of 20 degrees Celsius and that for an ambient temperature of 90 degrees Celsius, the current percentage is 86% for the former case and 124% for the latter case, so that the difference is 0.54% per degree Celsius. If, therefore, the percentage of detection current value for an ambient temperature of 25 degrees Celsius is supposed to be 10%, a corrected current value I(T)[%] for an ambient temperature of T degrees Celsius can be obtained by the following equation:

$$I(T)=I0+0.54X(T-25) \quad (1)$$

(1-3) Effects of first embodiment

By the above-mentioned configuration, the switching device 50 detects a current flowing through the semiconductor switch and compares the detected current value to threshold data in consideration of the fuming characteristics of the harness 200 which is stored in a memory 60D beforehand. With this, to turn off the semiconductor switch when the current-duration product value equals or exceeds the threshold data, the device detects the ambient temperature of the harness 200 and corrects the detection current value according to thus detected ambient temperature, to compare the current-duration product value using thus corrected current value to the threshold data. If that product value for the corrected current value equals or exceeds the threshold data, the device turns off the semiconductor switch, enabling to execute the effective anti-fuming processing onto the harness without being affected by the heat from the engine or the semiconductor switch.

As temperature detection means to detect the ambient temperature of the harness 200, the above-mentioned configuration uses the existing temperature detection circuit 111 provided near the semiconductor switch to detect its temperature and supposes a detected temperature obtained by this circuit 111 when the corresponding semiconductor switch is off to be the ambient temperature of the harness 200, thus avoiding increases in the number of parts required.

(2) Second embodiment

Figure 13:
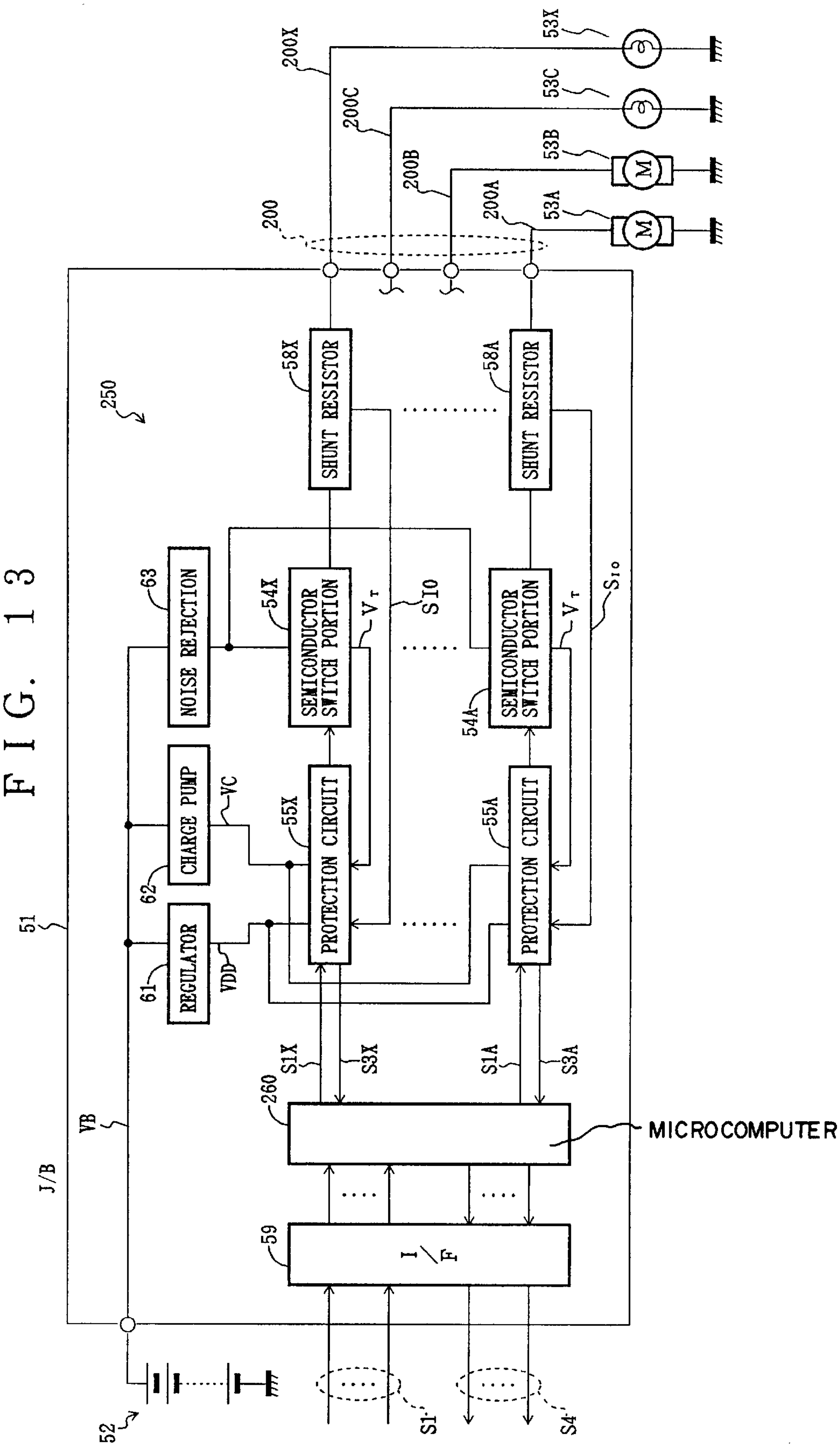
FIG. 13 is a block diagram showing an outlined configuration according to the second and third embodiments.
Figure 14:
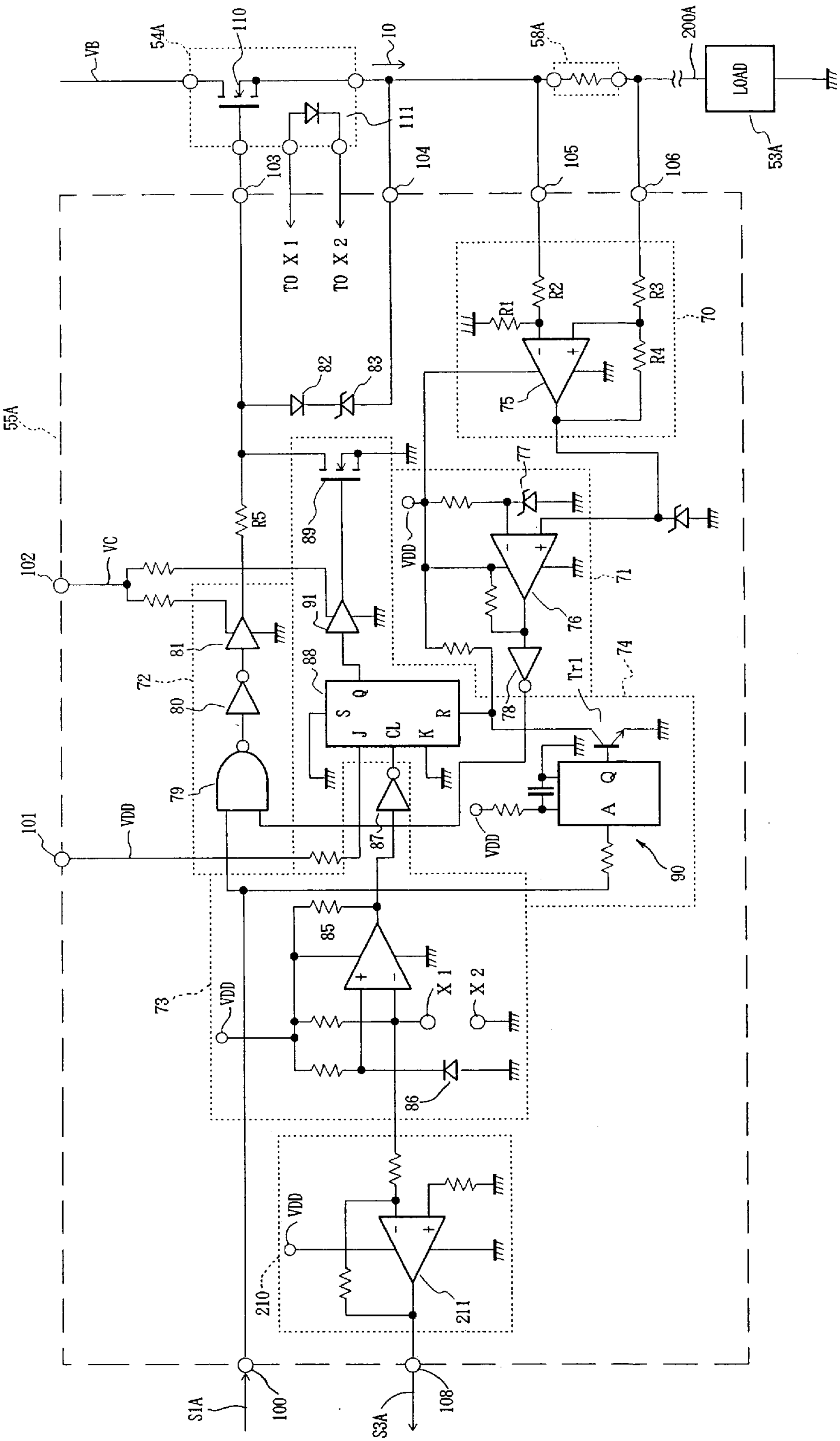
FIG. 14 is a block diagram showing a detailed configuration of a switching device according to the second and third embodiments.
Figure 15:
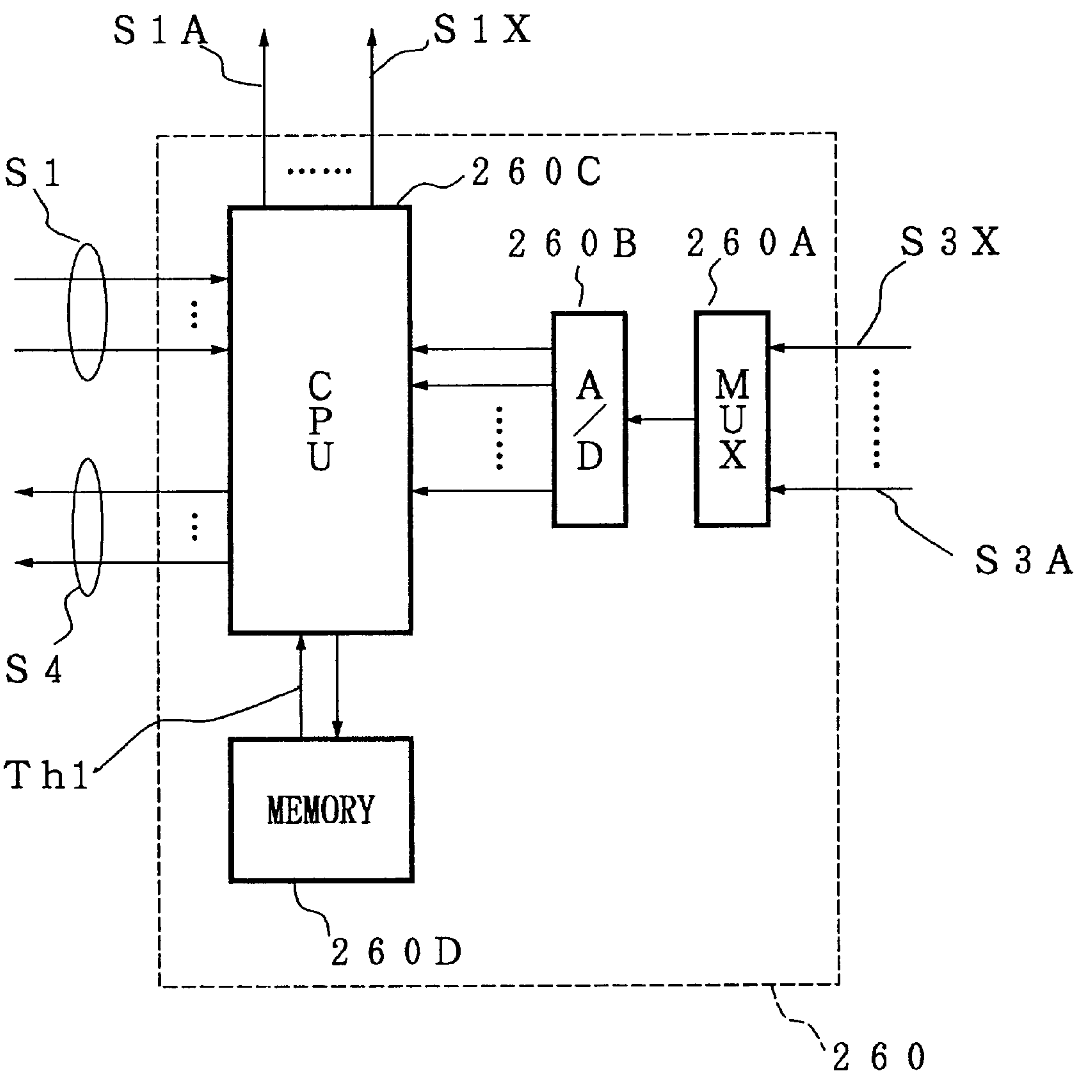
FIG. 15 is a block diagram showing a configuration of a microcomputer according to the second embodiment.

FIGS. 13, 14, and 15, in which the same or similar numerals used in FIGS. 6, 7, and 9 are applied to the same or similar parts shows a switching device 250 according to the second embodiment, which has the same configuration as the first embodiment except that it will not supply the data of currents flowing through the semiconductor switches (MOS FETs 110) to the microcomputer 260.

As shown in FIG. 15, the switching device 250 takes in temperature detection signals S3A through S3X sent to a microcomputer 260 to a CPU 260C via a multiplexer 260A and an analog-to-digital converter circuit 260B. A memory 260D stores threshold temperature data Th1 which indicates temperatures in a junction box 51 beyond which protection circuits 55A through 55X and other electronic parts which constitute the switching device 250 will be affected.

Figure 16:
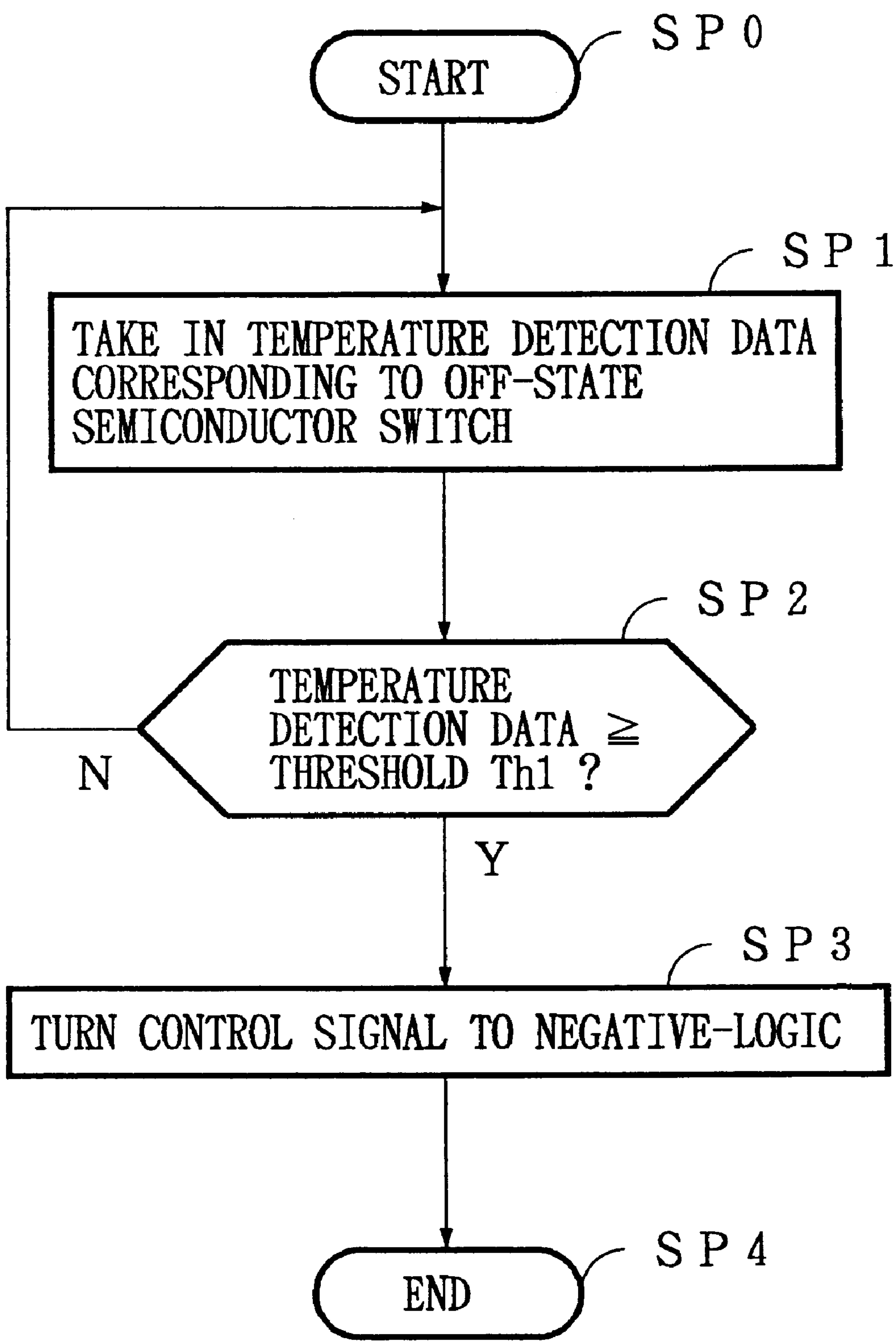
FIG. 16 is a flow chart showing a procedure by a microcomputer shown in FIG. 15.

The microcomputer 260C executes such a procedure as shown in FIG. 16.

That is, starting processing at a step SP0, the microcomputer 260C moves to a step SP1 to take in temperature detection data obtained by the temperature detection circuit 111 provided so as to correspond to a currently off state MOS FET110. If, here, no MOS FET 110 is in the off state, the microcomputer 260C takes in the data of the lowest detected temperature from among a plurality of temperature detection data pieces. The temperature detection data thus taken in at the step SP1 has been kept free from the effects of only particular MOS FETs 110 as much as possible and is supposed to be the ambient temperature of the MOS FETs 110, i.e. the temperature in the junction box 51, in this embodiment.

At a step SP2, the CPU 260C reads out the threshold temperature data Th1 from the memory 260D to compare it to the temperature detection data taken in at the step SP1. If the temperature detection data is equal to or higher than the threshold temperature data Th1, meaning that the ambient temperature of the MOS FETs 110, i.e. intra-junction box 51 temperature, has reached such a temperature that may affect the protection circuits 55A through 55X and other electronic parts, the CPU 260C moves to a step SP3 to sends out the negative-logic state of control signals S1A through S1X to turn off the MOS FETs 110, thus preventing a further increase in the temperature in the junction box 51 and puts an end to the processing. At the step SP3, it is also permitted to turn off all the MOS FETs 110 for a plurality of semiconductor switch portions 54A through 54X or to turn off only particular MOS FETs. When a negative decision is obtained at the step SP2, control returns back to the step SP1.

The above-mentioned configuration can realize a switching device that detects the ambient temperature of the semiconductor switch to turn it off when that ambient temperature equals or exceeds a certain value, thus preventing that ambient temperature from further increasing so as to avoid malfunctioning due to the heat or thermal deterioration of the electric circuits and parts provided around the semiconductor switch.

(3) Third embodiment

Figure 17:
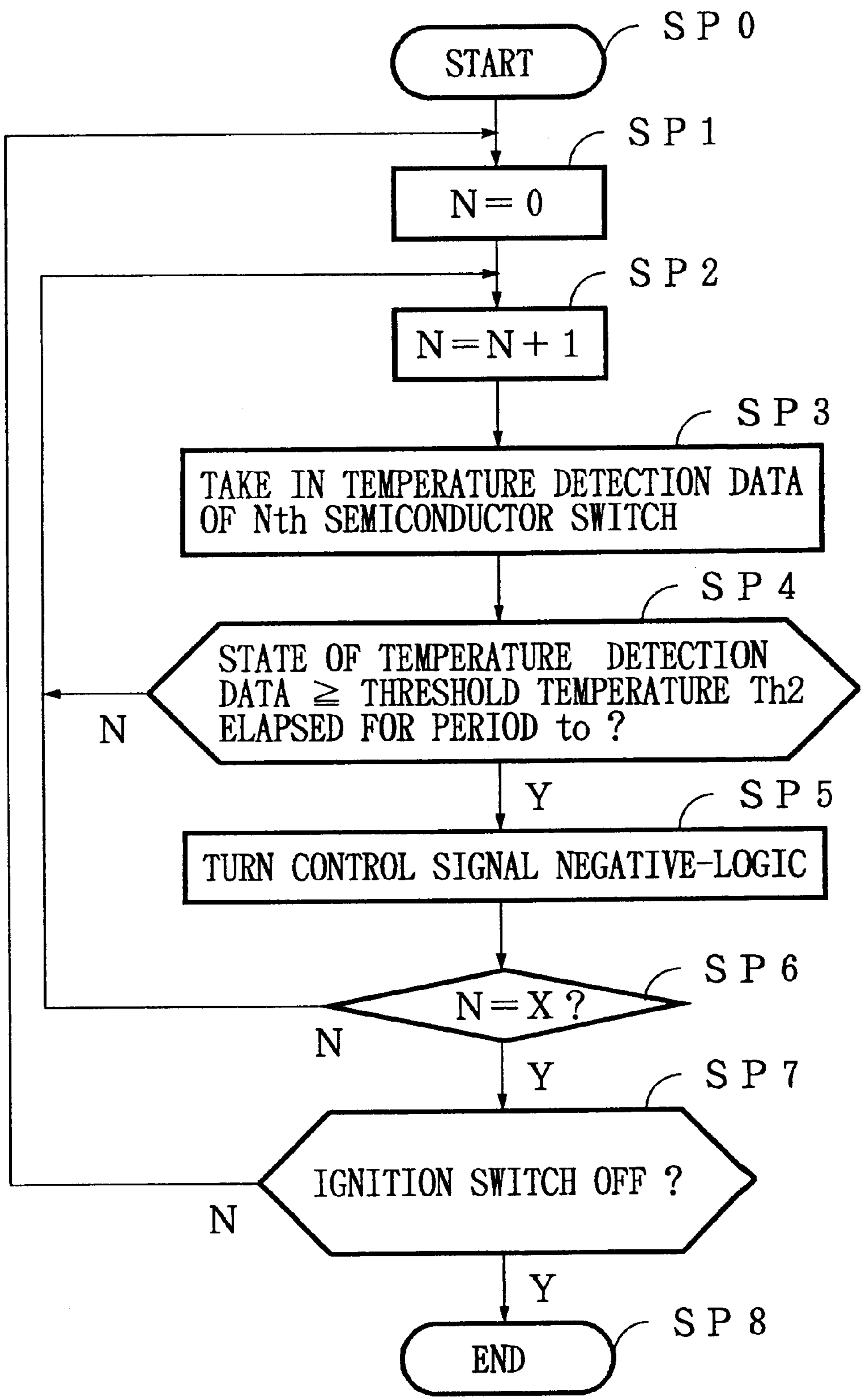
FIG. 17 is a flow chart showing a procedure by a microcomputer according to the third embodiment.

A switching device according to this embodiment has the same configuration as the one according to the second embodiment mentioned above with respect to FIGS. 13 through 15 except for the processing by the microcomputer. That is, by this embodiment, the memory 260D of the microcomputer 260C stores both threshold temperature data Th2 and duration data t0 such that the MOS FETs 110 will be significantly damaged or their ambient temperature will rise when a temperature, even if lower than the threshold temperature set at the comparator 85 of the overheat detection circuit 73 (see FIG. 14), is kept for the prescribed lapse of time or longer. With this, the CPU 260C uses those threshold temperature data Th2 and duration data t0 as well as the temperature detection data obtained from the temperature detection circuit 111 to execute a procedure shown in FIG. 17, thus preventing the circuits surrounding the MOS FETs 110 from being thermally deteriorated or affected due to the heat from those FETs.

Starting the processing at a step SP0, the CPU 260C resets the count value N of the counter at a step SP1 and moves to a step SP2 to increment the count value N and then moves to a step SP3. At the step SP3, the CPU 260C takes in from the analog-to-digital converter circuit 260B the temperature detection data that corresponds to the N'th MOS FET 110 from among a plurality of temperature detection data pieces which correspond to the temperature detection signals S3A through S3X each.

Next, at a step SP4, the CPU260C reads out the threshold temperature data Th2 and duration data t0 from the memory 260D to decide whether the state of the MOS FET 110 being held at a temperature equal to or higher than the threshold temperature Th2 has been kept for the period t0. Note here that the threshold temperature data Th2 and duration data t0 may be set appropriately according to the environment of the MOS FETs110, e.g. the volume of the junction box 51. A positive decision, if any, obtained at the step SP4 corresponds to the case where the MOS FETs 110 have been kept at a temperature a little below a threshold value set at the comparator 85 of the overheat detection circuit 73 in order to protect them from rapid heating, for example they have been kept at 140 degrees Celsius for a long time. In such a case, those MOS FETs 110 significantly deteriorate in performance or the intra-junction box 51 temperature rises to affect the circuits in that box.

To guard against this, if a positive decision is given at the step SP4, the CPU 260C moves to a step SP5 to send out negative-logic state control signals S1A through S1X to turn off the N'th MOS FET 110. Next, the CPU moves to a step SP6 to read out the count value N, in order to decide whether the processing of the steps SP3 through SP5 has been completed for all of the MOS FETs 110 for the semiconductor switch portions 54A through 54X. If having decided it to be negative, the CPU returns back to the step SP2 to increment the count value N and then executes the processing of the steps SP3 through SP5 for the next MOS FET 110.

When, in course of time, having completed the processing of the steps SP3 through SP5 for all of the MOS FETs 110 and having obtained a positive decision at the step SP6, the CPU 260C moves to a step SP7 to decide whether the ignition switch has been turned off. If it is not turned off yet, the CPU returns back to the step SP1 to execute the processing on all of the MOS FETs 110 for the second time. Thus, the CPU 260C repeats the processing on all of the MOS FETs 110 until the ignition switch is turned off, whereupon the CPU moves from the step SP7 to a step SP8 to put and end to this procedure.

By the above-mentioned configuration, besides the threshold temperatures set by the overheat detection circuit 73, the lower threshold temperature Th2 is set, so that when this temperature Th2 continues for a period t0 or longer, the semiconductor switch is turned off. With this, it is possible to protect the semiconductor switch from deteriorating thermally and also to inhibit its ambient temperature from rising further, thus preventing its surrounding circuits from being affected.

(4) Other embodiments (4-1) The present invention is not restricted to the first embodiment mentioned above with respect to the case where as the temperature detection means to detect the ambient temperature of cables connecting the semiconductor switches and the loads is used the existing temperature detection circuit 111 provided in the vicinity of the semiconductor switches to detect their temperature. Actually, the present invention may come in such embodiments that some special temperature sensors are provided near the cables (wire harness) or that the existing temperature sensors, if any near the cables (wire harness), are used as they are.

The current detection means, as which the shunt resistors 58A through 58X are used in the above-mentioned first embodiment, may come in any form as far as it would supply the microcomputer with the data of currents flowing through the semiconductor switches.

The present invention is not restricted to the first embodiment mentioned above with respect to the case where the device corrects the value of currents obtained by the current detection means according to the results of temperature detection obtained by the temperature detection means to detect the ambient temperature of the cables. Actually, to obtain the same effects as the first embodiment, the present invention may come in such an embodiment that the device corrects the current-duration product or threshold data ARA through ARX according to the results of temperature detection obtained by the temperature detection means. Note here that to correct only the data ARA out of threshold data pieces ARA through ARX, it is enough to, if an ambient temperature higher than the reference for example 25 degrees Celsius is detected, correct the data ARA into new threshold data ARA1 lower than that by that difference in temperature and also to, if an ambient temperature lower than that reference is detected, correct the data ARA into new threshold data ARA2 high than that by that difference in temperature.

Figure 18:
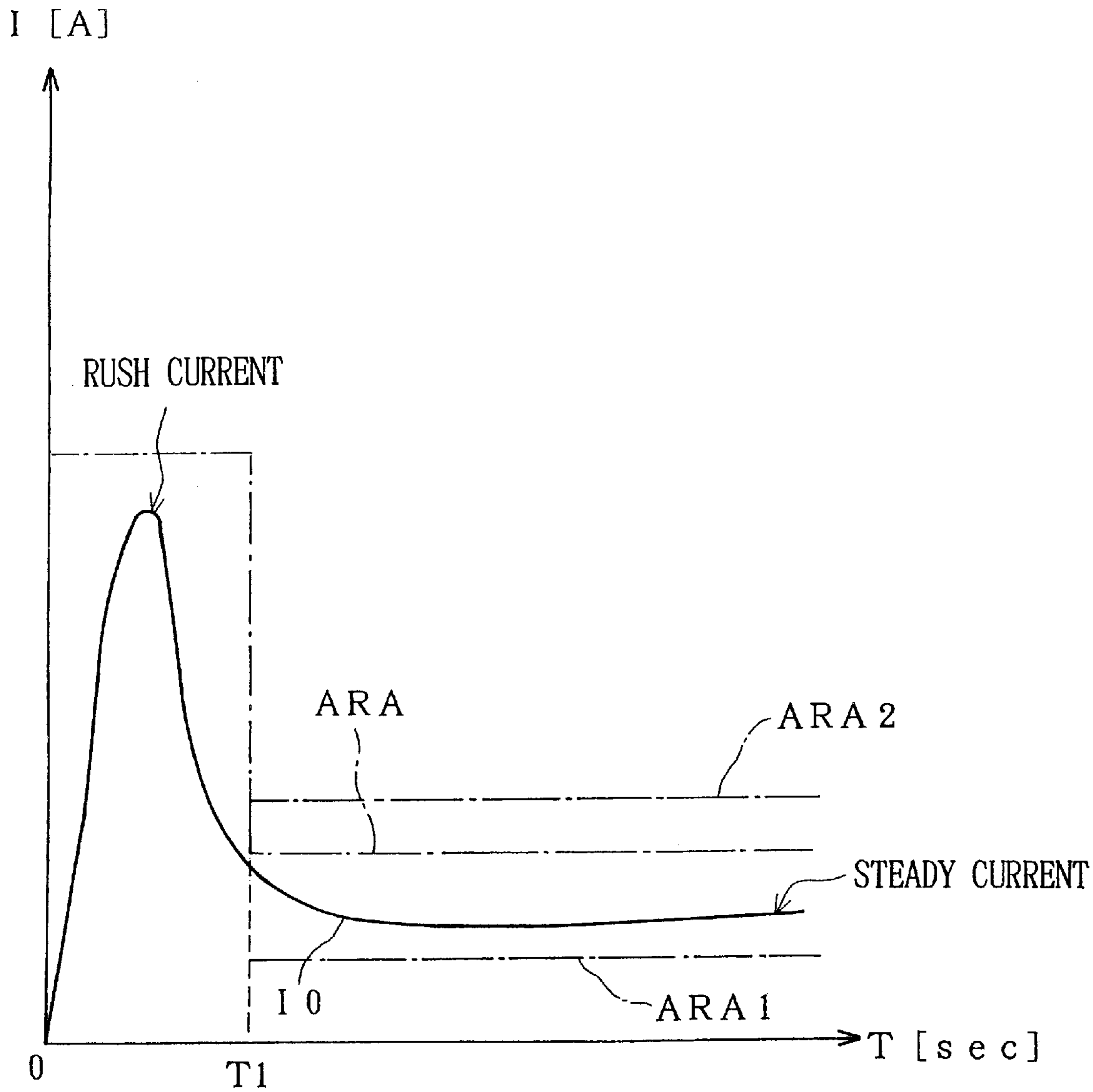
FIG. 18 is a graph used in the description of threshold data correction according to the ambient temperature of a wire harness according to other embodiments.
Figure 19:
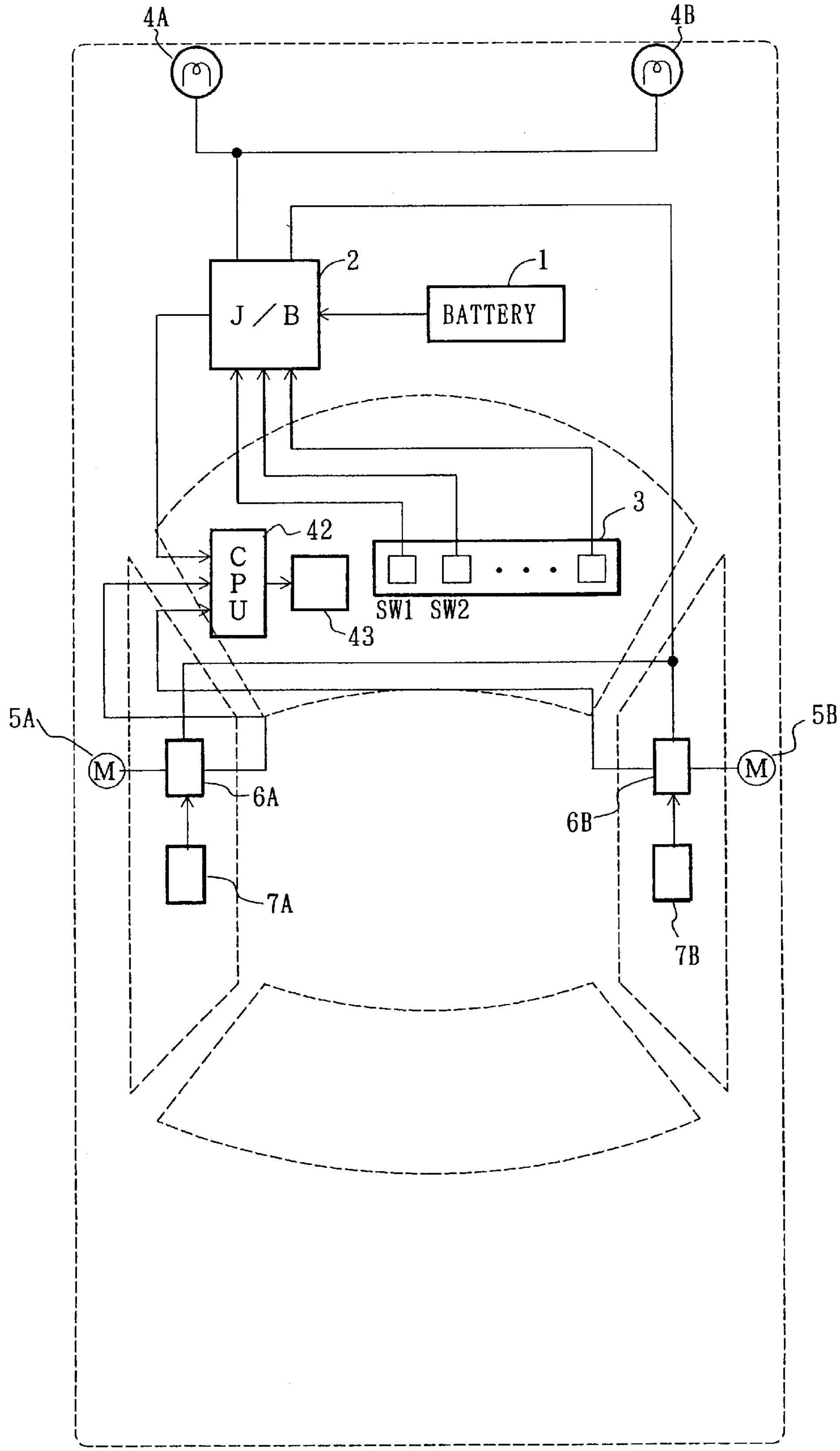
FIG. 19 is a known schematic diagram used in the description of power supplying to each load in a car.
Figure 20:
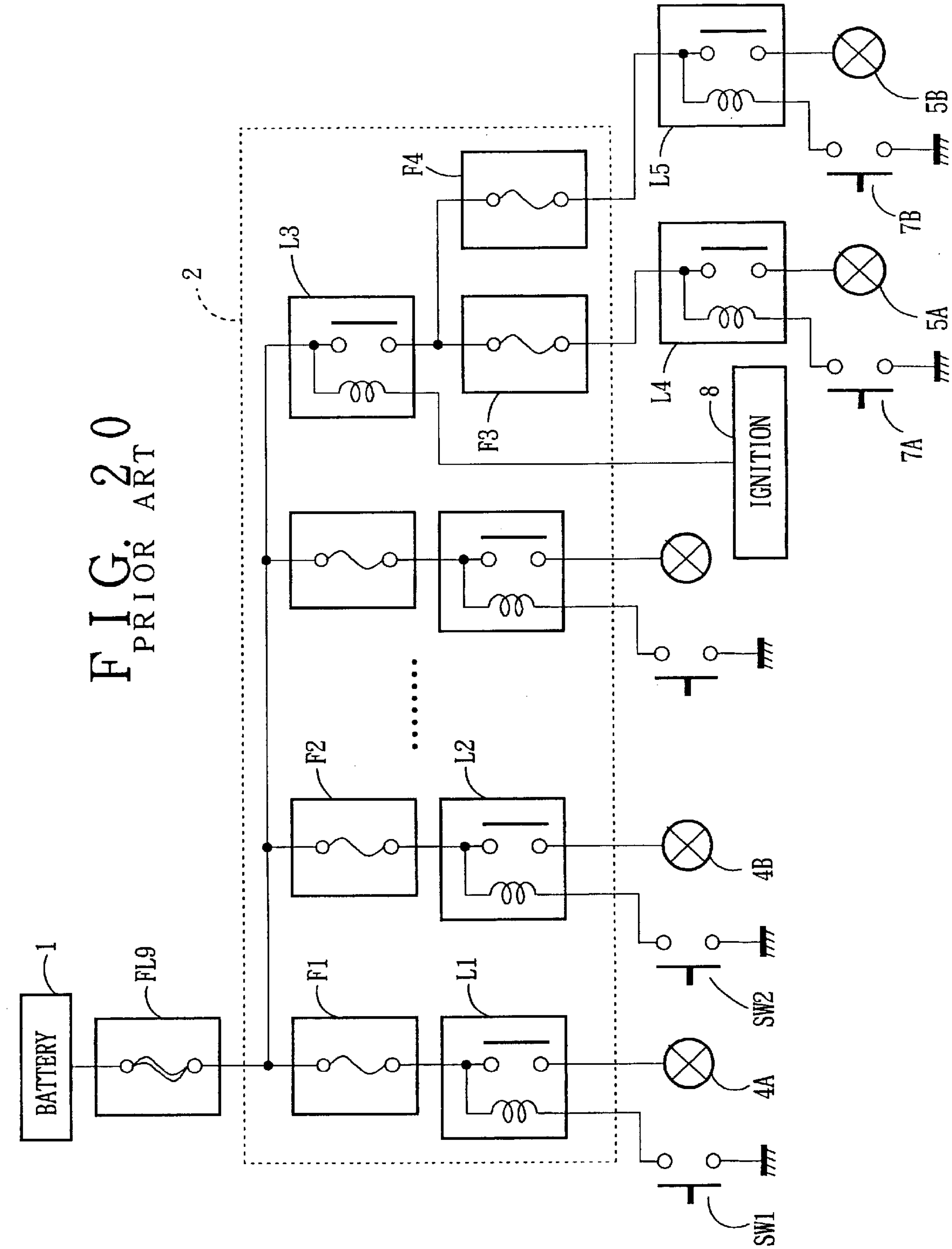
FIG. 20 is a known schematic diagram used in the description of a junction box using relays with mechanical contacts.
Figure 21:
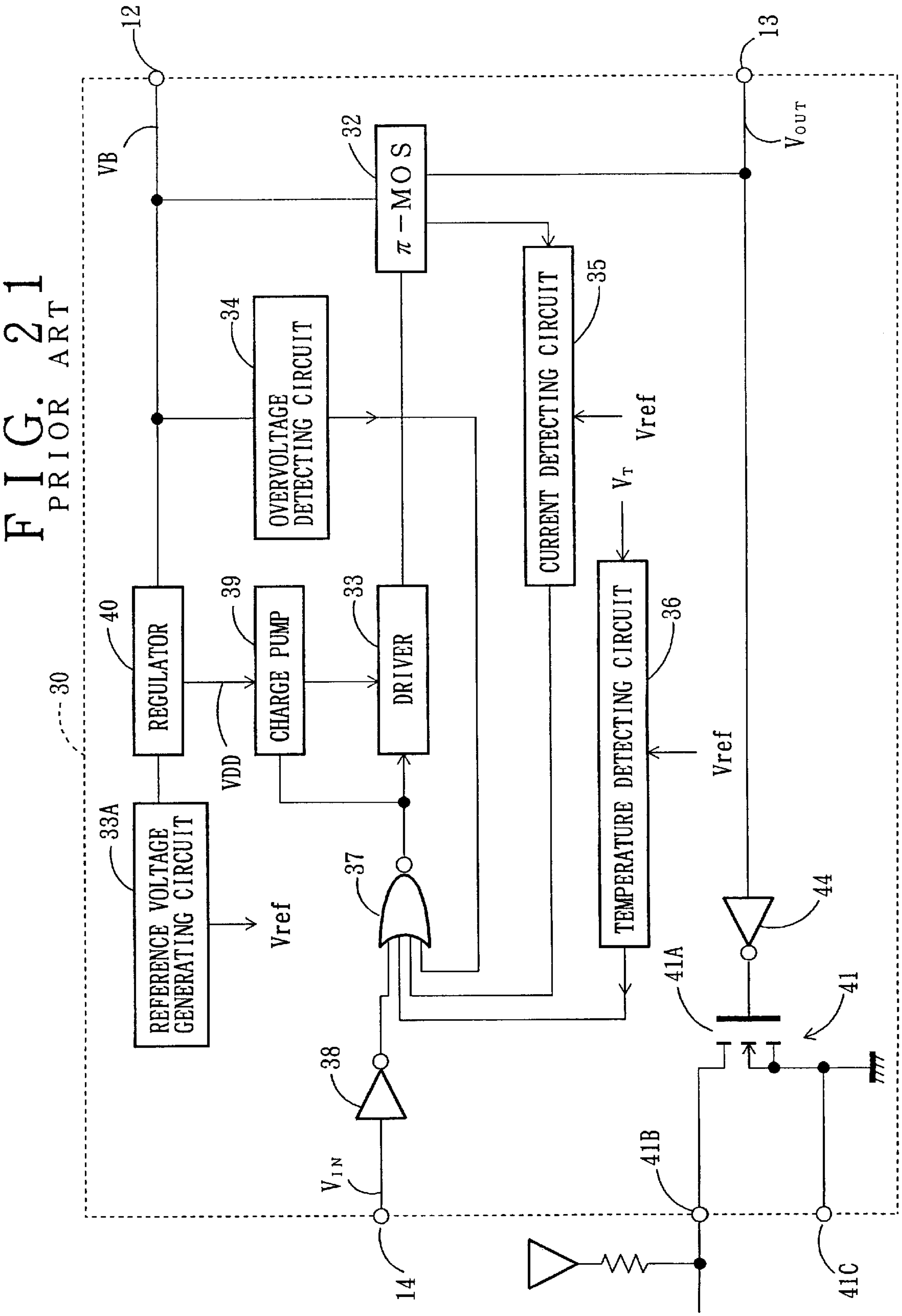
FIG. 21 is a block diagram showing a configuration of a conventional intelligent power switch.

Also, not restricted to this embodiment, the present invention may come in such an embodiment that the device stores in the data storage means tantamount to the memory 60D in FIG. 9 a plurality of threshold data pieces for example ARA, ARA1, ARA22, etc. in FIG. 18 which are set beforehand in consideration of the fuming characteristics of the cables for each plurality of ambient temperatures, so that the CPU 60C reads out from the data storage means the threshold data ARA, ARA1, OR ARA2 corresponding to a temperature, as the address, detected by the temperature detection means to compare thus read out threshold data to the current-duration product obtained by the current detection means, so that the corresponding semiconductor switch is turned off when that product value equals or exceeds that threshold data value.

(4-2) Also, not restricted to the above-mentioned embodiment where the MOS FET 110 is used as the semiconductor switch, the semiconductor switch according to the present invention may come in other types to obtain the same effects as the above-mentioned one.

The present invention can be widely applied to switching devices that at its both ends some loads are connected via cables, not being restricted to the above-mentioned embodiment where the present invention is applied to such a switching device that the junction box contains a plurality of semiconductor switches and a plurality of protection circuits which are provided corresponding to those semiconductor switches each to turn off any of those semiconductor switches if it is subjected to overheated or over-current, thus protecting it from overheat or over-current respectively.

What is claimed is:

1. A switching device comprising:

a semiconductor switch which is turned on depending on the input of the control signal at the control signal input terminal, to furnish power to a load connected to the output terminal;

temperature detection means which detects the ambient temperature of a cable interconnecting the semiconductor switch and the load;

current detection means which detects the magnitude of an electric current flowing through the semiconductor switch;

data storage means which stores threshold data which considers the fuming characteristics of the cable;

correction means which corrects the value of a current obtained at the current detection means according to the temperature detection results obtained at the temperature detection means; and control means which compares the current-duration product of a correction current and its duration to the threshold data and, if that product exceeds that threshold data, feeds a signal to the semiconductor switch at its control signal input terminal to turn it off.

2. A switching device as set forth in claim 1, wherein the correction means would give higher corrected current values against higher ambient temperatures detected by the temperature detection means.

3. A switching device comprising:

a semiconductor switch which is turned on according to the control signal entered at the control signal input terminal, to furnish a power supply's power to a load connected to the output terminal;

temperature detection means which detects the ambient temperature of a cable interconnecting the semiconductor switch and the load;

current detection means which detects the magnitude of a current flowing through the semiconductor switch;

data storage means which stores threshold data which considers the fuming characteristics of that cable;

control means which compares the product of a current obtained by the current detection means and its duration to the threshold data and, if that product exceeds that threshold data, feeds a signal to the semiconductor switch at its control signal input terminal to turn it off; and correction means which corrects the value of the threshold data or the product compared and monitored by the control means, according to the results of temperature detection by the temperature detection means.

4. A switching device as set forth in claim 3, wherein said correction means would give higher values of the corrected current-duration product or lower values of the threshold data the higher the ambient temperature detected by the temperature detection means.

5. A switching device comprising:

a semiconductor switch which is turned on according to a control signal entered at the control signal input terminal, to provide power supply to a load connected at the output terminal;

temperature detection means which detects the ambient temperature of a cable interconnecting the semiconductor switch and the load;

current detection means which detects the magnitude of an electric current flowing through the semiconductor switch;

data storage means which stores a plurality of threshold data pieces through which are set in consideration of that cable's fuming characteristics for each plurality of its ambient temperatures; and control means which reads out from the data storage means an appropriate threshold data piece out of the plurality of threshold ones which matches the detection results by the temperature detection means and compares this threshold data to a current-duration product value obtained by the current detection means and, if that product is found to equal or exceed that threshold data value, feeds a signal to the semiconductor switch at its control signal input terminal, to turn it off.

6. A switching device as set forth in claim 5, wherein said temperature detection means is a temperature sensor provided in the vicinity of the semiconductor switch, to detect its temperature, so that the ambient temperature of the cable can be determined on the basis of the detection results of temperature by this sensor when the semiconductor switch is off.

7. A switching device as set forth in claim 5, wherein said switching device comprises over-current protection means that protect a semiconductor switch from an over-current by feeding it a signal at its control signal input terminal to turn it off when the value of a current obtained by current detection means exceeds a certain level.

8. A switching device as set forth in claim 5, wherein said switching device also comprises temperature detection means which detects the temperature of a semiconductor switch, and overheat protection means which protects the semiconductor switch from overheat by feeding it a signal at its control signal input terminal to turn it off when a temperature detected by this temperature detection means equals or exceeds a certain level.

9. A switching device comprising:

a semiconductor switch which is turned on according to a control signal entering the control signal input terminal, to feed the power of power supply to a load connected to the output terminal;

an overheat prevention circuit which protects the semiconductor switch from overheating by feeding it the control signal at its control signal input terminal to turn it off when that switch is overheated;

temperature detection means which detects the temperature of the semiconductor switch; and control means which monitors the detected temperature and, if thus detected temperature is below a temperature at which the semiconductor switch is turned off by the overheat prevention circuit and at the same time is higher than a certain level for a prescribed lapse of time, feeds a signal to that switch at its control signal input terminal to turn it off.

10. A switching device as set forth in claim 9, wherein said temperature detection means is formed in a similar semiconductor chip as the semiconductor switch is formed.

11. A switching device comprising:

a plurality of semiconductor switches which are turned on according to the control signal entered to the corresponding control signal input terminals to feed the power of power supply to a plurality of loads each connected to an output terminal of the semiconductor switches;

a plurality of protection circuits which each protect each of the semiconductor switches from overheat and over-current by feeding them the control signal at the control signal input terminals to turn them off when the semiconductor switches are subjected to overheating or over-current;

a housing for receiving the semiconductor switches and the protection circuits;

temperature detection means which detects an inside temperature of the housing; and control means which feeds the control signal to the semiconductor switches at the control signal input terminals to turn them off when the temperature detected by the temperature detection means equals or exceeds a prescribed value.

12. A switching device as set forth in claim 11, wherein said temperature detection means includes a plurality of corresponding temperature sensors provided near a plurality of semiconductor switches to detect their overheating, so that control means uses, in a decision in comparison to the threshold, the results of temperature detection obtained by a temperature sensor corresponding to any of the semiconductor switches which is turned off or any other temperature sensor having the lowest temperature detected.

13. A switching device as set forth in claim 12, wherein said temperature sensors are formed in a similar semiconductor chip as semiconductor switches are formed.

14. A switching device as set forth in claim 11, wherein the housing comes in a junction box mounted in a car.

* * * * *